United States Patent
Saito et al.

(10) Patent No.: US 9,899,568 B2
(45) Date of Patent: Feb. 20, 2018

(54) METHOD OF PRODUCING PERIODIC TABLE GROUP 13 METAL NITRIDE SEMICONDUCTOR CRYSTAL AND PERIODIC TABLE GROUP 13 METAL NITRIDE SEMICONDUCTOR CRYSTAL PRODUCED BY THIS PRODUCTION METHOD

(71) Applicant: MITSUBISHI CHEMICAL CORPORATION, Chiyoda-ku (JP)

(72) Inventors: Yuya Saito, Yokohama (JP); Sumitaka Itoh, Inashiki-gun (JP); Shigeru Terada, Chiyoda-ku (JP); Hiromitsu Kimura, Yokohama (JP)

(73) Assignee: Mistubishi Chemical Corporation, Chiyoda-ku (JP)

( * ) Notice: Subject to any disclaimer, the term of this patent is extended or adjusted under 35 U.S.C. 154(b) by 626 days.

(21) Appl. No.: 14/257,448

(22) Filed: Apr. 21, 2014

(65) Prior Publication Data
US 2014/0294713 A1   Oct. 2, 2014

Related U.S. Application Data

(63) Continuation of application No. PCT/JP2012/077047, filed on Oct. 19, 2012.

(30) Foreign Application Priority Data

Oct. 21, 2011  (JP) .................................. 2011-232166
Mar. 22, 2012  (JP) .................................. 2012-066169

(51) Int. Cl.
C01B 21/06    (2006.01)
C30B 19/12    (2006.01)
(Continued)

(52) U.S. Cl.
CPC .......... H01L 33/32 (2013.01); C01B 21/0632 (2013.01); C30B 19/12 (2013.01); C30B 29/403 (2013.01); H01L 29/2003 (2013.01)

(58) Field of Classification Search
None
See application file for complete search history.

(56) References Cited

U.S. PATENT DOCUMENTS

2002/0011599 A1   1/2002  Motoki et al.
2002/0189532 A1  12/2002  Motoki et al.
(Continued)

FOREIGN PATENT DOCUMENTS

EP    2 083 099 A1    7/2009
JP    2000-44400      2/2000
(Continued)

OTHER PUBLICATIONS

Lu et al.; Exciton Localization Behaviors of Basal Stacking Faults in alpha-Plane AlGaN Alloys; Journal of the Electrochemical Society; 158, H491-H495; 2011.*

(Continued)

Primary Examiner — Guinever S Gregorio
(74) Attorney, Agent, or Firm — Oblon, McClelland, Maier & Neustadt, L.L.P.

(57) ABSTRACT

For a Periodic Table Group 13 metal nitride semiconductor crystal obtained by epitaxial growth on the main surface of a base substrate that has a nonpolar plane and/or a semipolar plane as its main surface, an object of the present invention is to provide a high-quality semiconductor crystal that has a low absorption coefficient, is favorable for a device, and is controlled dopant concentration in the crystal, and to provide a production method that can produce the semiconductor crystal. A high-quality Periodic Table Group 13 metal nitride semiconductor crystal that has a precisely controlled (Continued)

dopant concentration within the crystal and a low absorption coefficient and that is thus favorable for a device, can be provided by inhibiting oxygen doping caused by impurity oxygen and having the Si concentration higher than the O concentration.

18 Claims, 9 Drawing Sheets

(51) Int. Cl.
  *C30B 29/40* (2006.01)
  *H01L 29/20* (2006.01)
  *H01L 33/32* (2010.01)

(56) References Cited

U.S. PATENT DOCUMENTS

| | | | |
|---|---|---|---|
| 2004/0211355 A1 | 10/2004 | Motoki et al. | |
| 2005/0098095 A1 | 5/2005 | D'Evelyn et al. | |
| 2006/0097353 A1 | 5/2006 | Motoki et al. | |
| 2009/0081110 A1 | 3/2009 | Shibata et al. | |
| 2009/0108407 A1 | 5/2009 | Motoki et al. | |
| 2010/0102330 A1 | 4/2010 | Motoki et al. | |
| 2010/0140536 A1 | 6/2010 | Shibata et al. | |
| 2010/0162945 A1 | 7/2010 | Shibata et al. | |
| 2011/0108852 A1 | 5/2011 | Fujiwara et al. | |
| 2011/0201184 A1 | 8/2011 | Motoki et al. | |
| 2011/0227198 A1* | 9/2011 | Wunderer | C30B 23/025 257/615 |

FOREIGN PATENT DOCUMENTS

| | | |
|---|---|---|
| JP | 2006-240988 | 9/2006 |
| JP | 2009-126723 A | 6/2009 |
| JP | 2009-269816 | 11/2009 |
| JP | 2010-030877 | 2/2010 |
| JP | 2010-509178 | 3/2010 |
| JP | 2010-070430 | 4/2010 |
| JP | 2010-105903 | 5/2010 |
| JP | 2011-63504 A | 3/2011 |
| JP | 2011-523931 A | 8/2011 |
| JP | 2011-178594 | 9/2011 |
| JP | 2011-230955 | 11/2011 |

OTHER PUBLICATIONS

Monemar et al.; Effect of Silicon and Oxygen Doping on Donor Bound Excitons in Bulk GaN; Physical Review B; 84, 165213; 2011.*

Office Action dated May 31, 2016 in Japanese Patent Application No. 2012-231353 (with unedited computer generated English translation).

English Translation of the International Preliminary Report on Patentability and Written Opinion dated May 1, 2014 in PCT/JP2012/077047.

Extended European Search Report dated Jul. 30, 2015 in Patent Application No. 12841826.6.

P. Prystawko, et al., "Doping of Homoepitaxial GaN Layers" Physica Status Solidi, vol. 210, No. 2, XP002491982, 1998, pp. 437-443.

T.B.Wei, et al., "Defect-related emission characteristics of nonpolar m-plane GaN revealed by selective etching" Journal of Crystal Growth, vol. 314, No. 1, XP027583468, 2011, pp. 141-145.

International Search Report dated Nov. 13, 2012 in PCT/JP2012/077047 filed Oct. 19, 2012.

P. Prystawko, et al., "Doping of Homoepitaxial GaN Layers" *Physica Status Solidi (b)*, vol. 210, No. 2, XP002491982, 1998, pp. 437-443.

* cited by examiner

METHOD OF PRODUCING PERIODIC TABLE GROUP 13 METAL NITRIDE SEMICONDUCTOR CRYSTAL AND PERIODIC TABLE GROUP 13 METAL NITRIDE SEMICONDUCTOR CRYSTAL PRODUCED BY THIS PRODUCTION METHOD

CROSS-REFERENCE TO RELATED APPLICATION

This is a continuation of International Application PCT/JP2012/077047, filed on Oct. 19, 2012, and designated the U.S., (and claims priority from Japanese Patent Application 2011-232166 which was filed on Oct. 21, 2011 and Japanese Patent Application 2012-066169 which was filed on Mar. 22, 2012,) the entire contents of which are incorporated herein by reference.

TECHNICAL FIELD

The present invention relates to a method of producing a Periodic Table Group 13 metal nitride semiconductor crystal and to a Periodic Table Group 13 metal nitride semiconductor crystal produced by this production method.

BACKGROUND ART

A Periodic Table Group 13 metal nitride semiconductor represented by gallium nitride has large band gap, and interband transition is a direct transition. Therefore, the Periodic Table Group 13 metal nitride semiconductor has been put into practical use as light emitting elements at relatively short wavelength side such as ultraviolet or blue light emitting diodes and semiconductor lasers. In addition, the production of the gallium nitride substrates used in these devices has also been realized as a consequence of developments in crystal growth technology in recent years.

Silicon and oxygen are known as dopants that make Periodic Table Group 13 metal nitride semiconductor crystals into the n-type, and it is known that doping can be carried out when a Periodic Table Group 13 metal nitride semiconductor crystal is produced by a vapor-phase growth method by feeding, e.g., silane gas ($SiH_4$), into the growth atmosphere as a silicon source and by feeding, e.g., water or oxygen, into the growth atmosphere as an oxygen source. However, facial selectivity has been reported to occur in the doping of oxygen into gallium nitride, and it is known that the incorporation of oxygen is impaired in epitaxial growth for which the growth plane is the C-plane and a satisfactory oxygen doping cannot then be achieved (refer to Patent Document 1). As a consequence, results have been reported of a large amount of silicon doping for gallium nitride crystals obtained by C-plane growth and a large amount of oxygen doping for gallium nitride crystals for which the growth plane is a crystal plane other than the C-plane (refer to Patent Documents 1 and 2).

In addition, for gallium nitride crystals obtained by facet growth on a base substrate for which the C-plane is the main surface, the results have been reported of a large amount of oxygen doping at the facet growth region and a large amount of silicon doping at the C-plane growth region (refer to Patent Document 3).

When, on the other hand, a Periodic Table Group 13 metal nitride crystal is used for a light-emitting device, it must be capable of efficiently emitting light when used in the device, and the production of a crystal in which there are few crystal defects is required in order to improve the efficiency of light emission. Problems with Periodic Table Group 13 metal nitride semiconductor crystals include the problem of spontaneous polarization and the problem of a reduction in the internal quantum efficiency due to the occurrence of piezoelectric polarization. The problem, inter alia, of the reduction in the internal quantum efficiency could be solved if a crystal could be formed on a nonpolar plane of a Periodic Table Group 13 metal nitride semiconductor crystal, but the current situation is that it is very difficult to bring about the epitaxial growth of a Periodic Table Group 13 metal nitride semiconductor crystal having a low stacking fault density on a nonpolar plane or a semipolar plane.

To respond to this problem, the formation on the substrate of an intermediate layer containing, for example, carbon and aluminum, has been proposed (refer to Patent Document 4).

In addition, a method has been proposed in which a Periodic Table Group 13 metal nitride semiconductor crystal having little surface unevenness is produced by growing the Periodic Table Group 13 metal nitride semiconductor crystal on a seed in a solution containing the element nitrogen and a Periodic Table Group 13 metal in a molten salt wherein a semipolar plane is the main surface of the seed (refer to Patent Document 5).

[Patent Document 1] Japanese Patent Application Laid-open No. 2000-044400
[Patent Document 2] Japanese Patent Application Laid-open No. 2006-240988
[Patent Document 3] Japanese Patent Application Laid-open No. 2010-070430
[Patent Document 4] Japanese Patent Application Laid-open No. 2010-030877
[Patent Document 5] Japanese Patent Application Laid-open No. 2011-178594

DISCLOSURE OF THE INVENTION

When a Periodic Table Group 13 metal nitride semiconductor crystal is obtained by a vapor-phase growth method, oxygen doping caused by impurity oxygen present in the growth atmosphere or starting materials readily occurs during crystal growth, and as a result a crystal that has a relatively large amount of oxygen doping tends to be formed. When device formation is carried out using a highly oxygen-doped crystal as the substrate, a part of the light generated from the device is absorbed in the substrate since the absorption coefficient of a crystal is increased by oxygen doping, and the problem then arises that the amount of light emitted is ultimately reduced. In addition, precise control of the dopant concentration within the crystal is quite difficult with the oxygen doping that originates with impurity oxygen.

Oxygen incorporation tends to be impeded in epitaxial growth in which the C-plane is the growth plane, in which case the problems identified above can then be solved naturally. However, these problems become critical from a quality perspective for a Periodic Table Group 13 metal nitride semiconductor crystal obtained by epitaxial growth on the main surface of a base substrate in which a nonpolar plane and/or semipolar plane is the main surface. Another major problem is that many stacking faults are produced in a Periodic Table Group 13 metal nitride semiconductor crystal that is epitaxially grown on a nonpolar plane or semipolar plane.

That is, for a Periodic Table Group 13 metal nitride semiconductor crystal obtained by epitaxial growth on the main surface of a base substrate that has a nonpolar plane and/or a semipolar plane as its main surface, an object of the present invention is to provide a Periodic Table Group 13 metal nitride semiconductor crystal that has a precisely controlled dopant concentration in the crystal, has a low absorption coefficient, and is particularly favorable as a device substrate, and preferably to provide a Periodic Table Group 13 metal nitride semiconductor crystal that has few stacking faults. A further object of the present invention is to provide a production method that can produce such a Periodic Table Group 13 metal nitride semiconductor crystal.

As the result of extensive and intensive investigations in order to achieve these objects, the present inventors discovered that, for a Periodic Table Group 13 metal nitride semiconductor crystal obtained by epitaxial growth on the main surface of a base substrate for which the main surface is a nonpolar plane and/or a semipolar plane, a Periodic Table Group 13 metal nitride semiconductor crystal with inhibited oxygen doping caused by impurity oxygen and with an Si concentration made higher than the O concentration, is a high-quality crystal that has a low absorption coefficient and is favorable as a device substrate, and also makes possible a precise control of the dopant concentration. The present invention was achieved based on these discoveries.

That is, the present invention is as follows.

(1) A Periodic Table Group 13 metal nitride semiconductor crystal obtained by epitaxial growth on a base substrate for which a main surface thereof is a nonpolar plane and/or a semipolar plane, wherein the Si concentration within the crystal is higher than O concentration.

(2) A Periodic Table Group 13 metal nitride semiconductor crystal obtained by epitaxial growth in which at least 92% of a growth plane is a nonpolar plane and/or a semipolar plane, wherein the Si concentration in the crystal as a whole is higher than O concentration.

(3) The Periodic Table Group 13 metal nitride semiconductor crystal according to (1), having a dislocation extending in a direction orthogonal to a nonpolar plane or a semipolar plane.

(4) The Periodic Table Group 13 metal nitride semiconductor crystal according to (3), wherein the dislocation density of the dislocation is not greater than $1.0 \times 10^8$ cm$^{-2}$.

(5) The Periodic Table Group 13 metal nitride semiconductor crystal according to any one of (1) to (4), wherein the Si concentration is at least $1 \times 10^{13}$ cm$^{-3}$.

(6) The Periodic Table Group 13 metal nitride semiconductor crystal according to any one of (1) to (5), wherein the O concentration is not greater than $3 \times 10^{18}$ cm$^{-3}$.

(7) The Periodic Table Group 13 metal nitride semiconductor crystal according to any one of (1) to (6), wherein the Na concentration within the crystal is not greater than $1 \times 10^{17}$ cm$^{-3}$.

(8) The Periodic Table Group 13 metal nitride semiconductor crystal according to any one of (1) to (7), which is a gallium nitride crystal obtained by the epitaxial growth of a gallium nitride crystal growth layer on a base substrate formed of gallium nitride for which a main surface thereof is a nonpolar plane or a semipolar plane.

(9) The Periodic Table Group 13 metal nitride semiconductor crystal according to (8), wherein, for the gallium nitride crystal growth layer, the emission intensity ratio of the emission at 3.41 eV to the band edge emission (NBE peak), as measured by a cryogenic PL measurement, is not greater than 0.1.

(10) The Periodic Table Group 13 metal nitride semiconductor crystal according to (8) or (9), wherein, for the base substrate formed of gallium nitride, the emission intensity ratio of the emission at 3.41 eV to the band edge emission (NBE peak), as measured by a cryogenic PL measurement, is at least 0.1.

(11) The Periodic Table Group 13 metal nitride semiconductor crystal according to any one of (8) to (10), wherein the growth thickness of the gallium nitride crystal growth layer is at least 10 μm.

(12) The Periodic Table Group 13 metal nitride semiconductor crystal according to any one of (8) to (11), wherein the main surface of the base substrate formed of gallium nitride is a nonpolar plane.

(13) A method of producing a Periodic Table Group 13 metal nitride semiconductor crystal, the method comprising:
a step of preparing a solution or a melt containing a starting material and a solvent; and a growth step of epitaxially growing, in the presence of a liquid phase that is the solution or the melt and in the presence of a gas phase that has a hydrogen molecule and/or a hydride, a Periodic Table Group 13 metal nitride semiconductor crystal in the liquid phase, wherein the staring material is a complex nitride that contains a Periodic Table Group 13 metal and a Periodic Table Group 1 metal and/or a Periodic Table Group 2 metal.

(14) The method of producing a Periodic Table Group 13 metal nitride semiconductor crystal according to (13), wherein the solvent is a solvent in which a main component is a metal salt.

The present invention can provide a high-quality Periodic Table Group 13 metal nitride semiconductor crystal that has a precisely controlled dopant concentration within the crystal and a low absorption coefficient and that is thus favorable as a substrate for device formation.

BEST MODE FOR CARRYING OUT THE INVENTION

Figure 1:
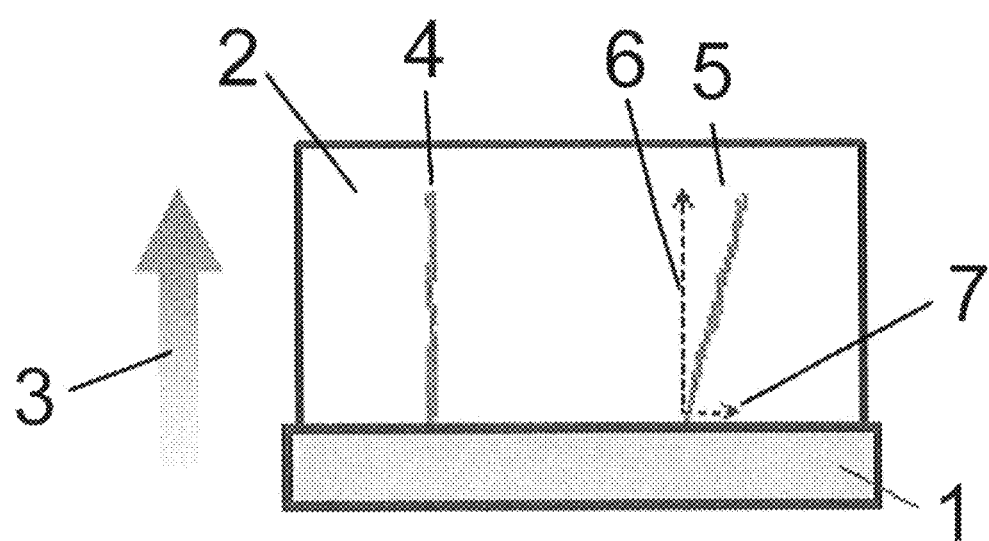
FIG. 1 is a schematic diagram that shows the direction of dislocation extension.

The Periodic Table Group 13 metal nitride semiconductor crystal of the present invention and the method of the present invention for producing a Periodic Table Group 13 metal nitride semiconductor crystal are described in detail herebelow, but there is no limitation to this content insofar as the concept of the present invention is not violated.

Numerical range represented using "from . . . to" in this Description means a range including the numerical values described after "from" and after "to" as a lower limit and an upper limit, respectively. In this Description, "principal plane" of a Periodic Table Group 13 metal nitride semiconductor crystal is the largest (broadest) plane in the Periodic Table Group 13 metal nitride semiconductor crystal, and refers to the plane where crystal growth should be carried out.

The present invention is an invention that relates to a Periodic Table Group 13 metal nitride semiconductor crystal. The polar planes of a Periodic Table Group 13 metal nitride semiconductor crystal having an hexagonal crystal structure (wurtzite crystal structure) can be exemplified by the (0001) plane and the (000-1) plane, while the nonpolar planes thereof can be exemplified by the (10-10) plane, the (11-20) plane, and planes that are equivalent to these planes in terms of crystal geometry. In addition, a semipolar plane is a plane in which the element nitrogen and a Periodic Table Group 13 metal element are both present in the crystal plane wherein their occurrence ratio is not 1:1, but is not otherwise particularly limited and can be exemplified by the (20-21) plane, (20-2-1) plane, (10-11) plane, (10-1-1) plane, (10-12) plane, (10-1-2) plane, (11-21) plane, (11-2-1) plane, (11-2-2) plane, (11-22) plane, (22-41) plane, (22-4-1) plane, and planes that are equivalent to these planes in terms of crystal geometry.

In this Description, the (0001) plane and (000-1) plane, i.e., the polar planes, may be abbreviated into "C-plane" and the (10-10) plane and planes equivalent to this plane in terms of crystal geometry may be abbreviated into "M-plane".

In this Description, when a C plane, an M plane, or a specific index plane is named, the named plane encompasses planes within a range having an off angle of not more than 10°, preferably not more than 5°, and more preferably not more than 3°, from the respective crystal axes measured to an accuracy of within ±0.01°.

<The Periodic Table Group 13 Metal Nitride Semiconductor Crystal>

The Periodic Table Group 13 metal nitride semiconductor crystal of the present invention is a Periodic Table Group 13 metal nitride semiconductor crystal obtained by epitaxial growth on a base substrate whose main surface is a nonpolar plane and/or a semipolar plane, and is characterized in that the Si concentration within the crystal is higher than the O concentration. Here, "within the crystal" denotes the entire crystal that has been formed by epitaxial growth. As noted above, for a Periodic Table Group 13 metal nitride semiconductor crystal obtained by other than C-plane growth, for example, by epitaxial growth on a base substrate whose main surface is a nonpolar plane and/or a semipolar plane, oxygen doping caused by impurity oxygen readily occurs, and thus a precise control of the dopant concentration is problematic and the absorption coefficient also ends up increasing (the crystal takes on color) and as a consequence improvements from a quality standpoint have been required. The present invention is a Periodic Table Group 13 metal nitride semiconductor crystal in which oxygen doping caused by impurity oxygen is inhibited and the Si concentration is made higher than the O concentration and is a high-quality Periodic Table Group 13 metal nitride semiconductor crystal that enables a precise control of the dopant concentration through the amount of silicon doping.

There are no particular limitations on the dopant concentration of the Periodic Table Group 13 metal nitride semiconductor crystal of the present invention as long as the crystal has an Si concentration within the crystal that is higher than the O concentration. The dopant concentration will generally be at least $1\times10^{13}$ cm$^{-3}$ and is preferably at least $1\times10^{14}$ cm$^{-3}$ and is more preferably at least $1\times10^{17}$ cm$^{-3}$ and will generally be not more than $1\times10^{21}$ cm$^{-3}$ and is preferably not more than $1\times10^{20}$ cm$^{-3}$ and is more preferably not more than $5\times10^{19}$ cm$^{-3}$. An excessively large dopant concentration can cause a loss of the properties as a semiconductor, while an excessively low dopant concentration results in a low electroconductivity and is thus unfavorable for a light-emitting device substrate where a high electroconductivity is preferred.

In addition, there are no particular limitations on the carrier concentration of the Periodic Table Group 13 metal nitride semiconductor crystal of the present invention as long as the crystal has an Si concentration within the crystal that is higher than the O concentration. The carrier concentration will generally be at least $1\times10^{13}$ cm$^{-3}$ and is preferably at least $1\times10^{14}$ cm$^{-3}$ and is more preferably at least $1\times10^{17}$ cm$^{-3}$ and will generally be not more than $1\times10^{21}$ cm$^{-3}$ and is preferably not more than $1\times10^{20}$ cm$^{-3}$ and is more preferably not more than $5\times10^{19}$ cm$^{-3}$. An excessively large carrier concentration can cause a loss of the properties as a semiconductor, while an excessively low carrier concentration results in a low electroconductivity and is thus unfavorable for a light-emitting device substrate where a high electroconductivity is preferred.

The specific values of the O concentration and Si concentration are not particularly limited, but the O concentration will generally be at least $1\times10^{13}$ cm$^{-3}$ and is preferably at least $1\times10^{14}$ cm$^{-3}$ and will generally be not more than $3\times10^{18}$ cm$^{-3}$ and is preferably not more than $5\times10^{17}$ cm$^{-3}$ and is more preferably not more than $5\times10^{16}$ cm$^{-3}$. An excessively large O concentration causes a large absorption coefficient for light and can also cause a loss of the properties as a semiconductor, while an excessively low O concentration results in a low electroconductivity and is thus unfavorable for a light-emitting device substrate where a high electroconductivity is preferred.

The Si concentration will generally be at least $1\times10^{13}$ cm$^{-3}$ and is preferably at least $1\times10^{17}$ cm$^{-3}$ and will generally be not more than $1\times10^{21}$ cm$^{-3}$ and is preferably not more than $1\times10^{20}$ cm$^{-3}$ and is more preferably not more than $1\times10^{19}$ cm$^{-3}$. An excessively large Si concentration can cause a loss of the properties as a semiconductor, while an excessively low Si concentration results in a low electroconductivity and is thus unfavorable for a light-emitting device substrate where a high electroconductivity is preferred.

As long as the crystal has an Si concentration within the crystal that is higher than the O concentration, there are no particular limitations on the concentrations of other elements in the Periodic Table Group 13 metal nitride semiconductor crystal of the present invention. For example, the Na concentration is generally not more than $1\times10^{17}$ cm$^{-3}$ and is preferably not more than $1\times10^{16}$ cm$^{-3}$ and is more preferably not more than $1\times10^{15}$ cm$^{-3}$. An excessively large Na concentration can cause a loss of the properties as a semiconductor.

It is known that dislocations that extend parallel to the direction of growth are present in Periodic Table Group 13 metal nitride semiconductor crystals obtained by epitaxial growth (refer to Japanese Patent Application Laid-open No. 2007-84435). In a strict sense, there is a tendency for numerous dislocations to be present that are not perfectly parallel to the growth direction, but for which the main direction is parallel to the growth direction. When the direction of dislocation extension is resolved into a component in the growth direction and a component orthogonal to the growth direction, the "main direction" refers to the direction of the largest component. When this is considered with reference to FIG. 1, the direction of extension of the dislocation 5 can be resolved into a growth direction component 6 and a component 7 in the direction orthogonal to the growth direction, and, since the growth direction component 6 is the larger, the main direction is then the growth direction and the dislocation 5 is thus a dislocation for which the main direction is parallel to the growth direction. In this Description, Claims, Drawings, and Abstract, text concerning the direction of dislocation extension for the sake of convenience should be construed as intending the "main direction" of the dislocation and a dislocation parallel to the growth direction thus not only includes the dislocation 4 in FIG. 1, but also includes the dislocation 5.

Figure 2:
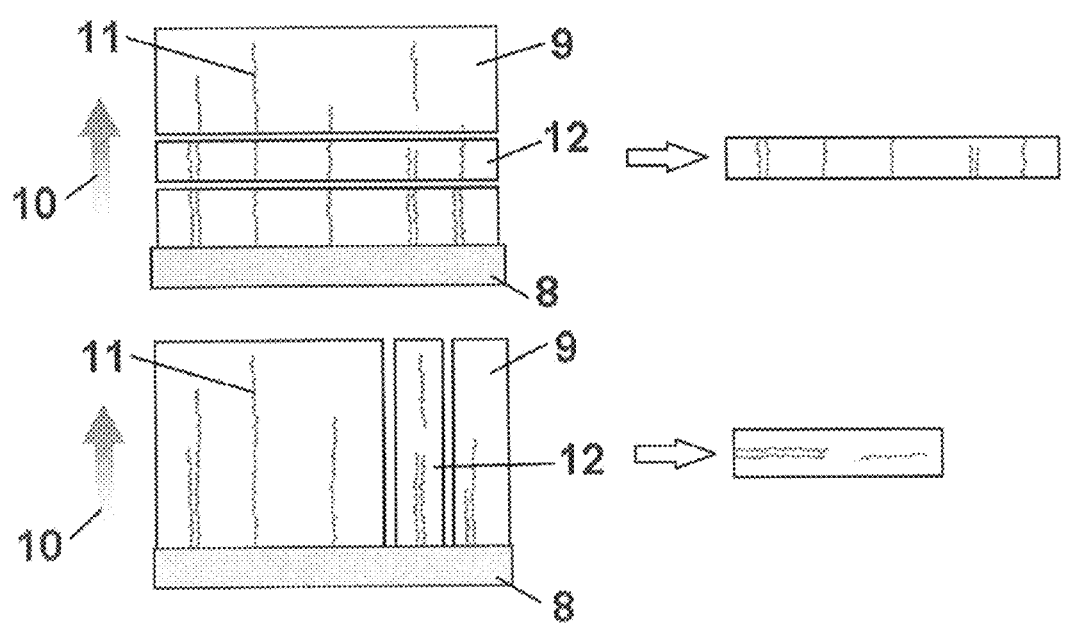
FIG. 2 is a schematic diagram that shows the direction of dislocation extension for crystal slices.

The dislocation direction within a crystal obtained by epitaxial growth is an index for discriminating which crystal plane of the base substrate was the main surface for epitaxial growth. This point is discussed with reference to FIG. 2. For example, threading dislocations parallel to the m-axis are present in a crystal epitaxially grown in the m-axis direction on the main surface of a base substrate having the nonpolar M-plane as the main surface, and as a consequence, as shown at the top in FIG. 2, dislocations orthogonal to the M-plane are present within a substrate whose main surface is the M-plane as obtained by slicing in parallel to the M-plane. On the other hand, within a substrate whose main surface is the M-plane and obtained by slicing, in parallel to the M-plane as shown at the bottom in FIG. 2, a crystal epitaxially grown in the c-axis direction on a base substrate in which the C-plane is the main surface, the dislocations extend in the c-axis direction and dislocations orthogonal to the m-axis are then present within this crystal, which as a consequence is different from the crystal described above.

When an M-plane substrate having the M-plane as the main surface is obtained from a crystal that has been epitaxially grown in the m-axis direction on the main surface of a base substrate having the M-plane as the main surface, the size of the obtained substrate will be close to the size of the base substrate, and as a consequence a large M-plane substrate may be readily obtained.

When, on the other hand, an M-plane substrate is obtained from a crystal that has been epitaxially grown in the c-axis direction on a base substrate for which the C-plane is the main surface, for example, growth in the c-axis direction in a thickness of at least 2 inches or 4 inches, respectively, must be carried out to obtain a 2-inch or 4-inch M-plane substrate, and the problem then arises that it is difficult to obtain a large substrate.

When a substrate whose main surface is a semipolar plane is sought, it is, for the same reason, easier to obtain a large semipolar plane substrate by epitaxial growth on the main surface of a base substrate whose main surface is a semipolar plane or a nonpolar plane, than by epitaxial growth on the main surface of a base substrate having a C-plane main surface.

There are no particular limitations on the dislocation direction and dislocation density of the Periodic Table Group 13 metal nitride semiconductor crystal of the present invention; however, since this is a crystal obtained by epitaxial growth on the main surface of a base substrate having a nonpolar plane and/or semipolar plane as its main surface, dislocations that extend in the direction orthogonal to the main surface of the base substrate will tend to be present (this also includes dislocations in which the main direction is parallel to the growth direction). The dislocation density (the dislocation density when measured from the nonpolar plane side or the semipolar plane side) for threading dislocations that extend in the direction orthogonal to the nonpolar plane or semipolar plane is generally not more than $1 \times 10^8$ cm$^{-2}$ and is preferably not more than $1 \times 10^7$ cm$^{-2}$ and is more preferably not more than $1 \times 10^6$ cm$^{-2}$.

The other properties of the Periodic Table Group 13 metal nitride semiconductor crystal of the present invention are not particularly limited as long as the crystal has an Si concentration within the crystal that is higher than the O concentration, but the full width at half maximum of the rocking curve for the (100) diffraction peak in x-ray diffraction is generally not more than 500 arcsec and is preferably not more than 200 arcsec, more preferably not more than 100 arcsec, and even more preferably not more than 50 arcsec.

In addition, the full width at half maximum of the rocking curve for the (300) diffraction peak in x-ray diffraction is generally not more than 500 arcsec, preferably not more than 200 arcsec, more preferably not more than 100 arcsec, and even more preferably not more than 50 arcsec.

The full width at half maximum in the rocking curve of the (102) diffraction peak in x-ray diffraction is generally not more than 500 arcsec, preferably not more than 200 arcsec, and more preferably not more than 100 arcsec. It is even more preferably not more than 50 arcsec.

When the full width at half maximum in the rocking curve of a diffraction peak in x-ray diffraction assumes an excessively high value, the poor crystallinity results in the entry of impurities, e.g., oxygen, into crystal defects and the O concentration then tends to become too high.

As noted above, since oxygen doping caused by impurity oxygen impurity oxygen readily occurs during epitaxial growth in which the growth plane is a nonpolar plane and/or a semipolar plane, for example, even with a crystal grown on a base substrate whose main surface is the C-plane, in the case of growth (facet growth) while forming facets of a nonpolar plane and/or semipolar plane without growth while forming a C-plane in the direction parallel to the c-axis, a large amount of oxygen doping occurs in this facet growth region and the absorption coefficient also increases. Improvement with regard to the quality of the overall crystal is thus required particularly for a crystal in which a large proportion thereof is a region in which the growth plane is a nonpolar plane and/or semipolar plane facet (facet growth regions), for example, in which at least 50% of the growth plane is a facet growth region.

The present inventors discovered that, even for a Periodic Table Group 13 metal nitride semiconductor crystal obtained by epitaxial growth in which at least 92%, preferably at least 95%, and more preferably at least 97% of the growth plane is a nonpolar plane and/or semipolar plane facet, a Periodic Table Group 13 metal nitride semiconductor crystal having inhibited oxygen doping caused by impurity oxygen and an Si concentration made higher than the O concentration, is a high-quality crystal that has a low absorption coefficient and is favorable as a substrate for device formation, and also makes possible precise control of the dopant concentration.

That is, the present invention is also a Periodic Table Group 13 metal nitride semiconductor crystal obtained by epitaxial growth in which at least 92%, preferably at least 95%, and more preferably at least 97% of the growth plane is a nonpolar plane and/or semipolar plane facet, wherein the Periodic Table Group 13 metal nitride semiconductor crystal has, in the crystal as a whole, an Si concentration that is higher than the O concentration.

The Periodic Table Group 13 metal nitride semiconductor crystal obtained by epitaxial growth in which at least 92%, preferably at least 95%, and more preferably at least 97% of the growth plane is a nonpolar plane and/or semipolar plane facet can be exemplified by a Periodic Table Group 13 metal nitride semiconductor crystal residing on a base substrate whose main surface is the C-plane (polar plane) and having a C-plane growth region and a facet growth region whose growth plane is a nonpolar plane and/or semipolar plane facet.

As long as the crystal has an Si concentration in the crystal as a whole that is higher than the O concentration, there are no particular limitations on the dopant concentration in the Periodic Table Group 13 metal nitride semiconductor crystal obtained by epitaxial growth in which at least 92%, preferably at least 95%, and more preferably at least 97% of the growth plane is a nonpolar plane and/or semipolar plane facet. The dopant concentration will generally be at least $1\times10^{13}$ cm$^{-3}$ and is preferably at least $1\times10^{14}$ cm$^{-3}$ and is more preferably at least $1\times10^{17}$ cm$^{-3}$ and will generally be not more than $1\times10^{21}$ cm$^{-3}$ and is preferably not more than $1\times10^{20}$ cm$^{-3}$ and is more preferably not more than $5\times10^{19}$ cm$^{-3}$. An excessively large dopant concentration can cause a loss of the properties as a semiconductor, while an excessively low dopant concentration results in a low electroconductivity, which is unfavorable for a light-emitting device substrate where a high electroconductivity is preferred.

In addition, there are no particular limitations on its carrier concentration, which will generally be at least $1\times10^{13}$ cm$^{-3}$ and is preferably at least $1\times10^{14}$ cm$^{-3}$ and is more preferably at least $1\times10^{17}$ cm$^{-3}$ and will generally be not more than $1\times10^{21}$ cm$^{-3}$ and is preferably not more than $1\times10^{20}$ cm$^{-3}$ and is more preferably not more than $5\times10^{19}$ cm$^{-3}$. An excessively large carrier concentration can cause a loss of the properties as a semiconductor, while an excessively low carrier concentration results in a low electroconductivity, which is unfavorable for a light-emitting device substrate where a high electroconductivity is preferred.

The specific values of the O concentration and Si concentration are not particularly limited, but the O concentration in regions where a nonpolar plane and/or semipolar plane facet is the growth plane will generally be at least $1\times10^{13}$ cm$^{-3}$ and is preferably at least $1\times10^{14}$ cm$^{-3}$ and will generally be not more than $3\times10^{18}$ cm$^{-3}$ and is preferably not more than $5\times10^{17}$ cm$^{-3}$ and is more preferably not more than $5\times10^{16}$ cm$^{-3}$. An excessively large O concentration causes a large absorption coefficient for light and can cause a loss of the properties as a semiconductor, while an excessively low O concentration results in a low electroconductivity, which is unfavorable for a light-emitting device substrate where a high electroconductivity is preferred.

The Si concentration in regions where a nonpolar plane and/or semipolar plane facet is the growth plane will generally be at least $1\times10^{13}$ cm$^{-3}$ and is preferably at least $1\times10^{17}$ cm$^{-3}$ and will generally be not more than $1\times10^{21}$ cm$^{-3}$ and is preferably not more than $1\times10^{20}$ cm$^{-3}$ and is more preferably not more than $1\times10^{19}$ cm$^{-3}$. In addition, the O concentration for the crystal as a whole will generally be at least $1\times10^{13}$ cm$^{-3}$ and is preferably at least $1\times10^{14}$ cm$^{-3}$ and will generally be not more than $3\times10^{16}$ cm$^{-3}$ and is preferably not more than $5\times10^{17}$ cm$^{-3}$ and is more preferably not more than $5\times10^{16}$ cm$^{-3}$.

The Si concentration for the crystal as a whole will generally be at least $1\times10^{13}$ cm$^{-3}$ and is preferably at least $1\times10^{17}$ cm$^{-3}$ and will generally be not more than $1\times10^{21}$ cm$^{-3}$ and is preferably not more than $1\times10^{20}$ cm$^{-3}$ and is more preferably not more than $1\times10^{19}$ cm$^{-3}$.

There are also no particular limitations on the concentrations of other elements in the crystal as a whole. For example, the Na concentration is generally not more than $1\times10^{17}$ cm$^{-3}$ and is preferably not more than $1\times10^{16}$ cm$^{-3}$ and is more preferably not more than $1\times10^{15}$ cm$^{-3}$. An excessively large Na concentration can cause a loss of the properties as a semiconductor.

As long as it is a nitride semiconductor crystal that contains a Periodic Table Group 13 metal, the Periodic Table Group 13 metal nitride semiconductor crystal of the present invention is not particularly limited with regard to type and may be exemplified by nitrides having a single species of Periodic Table Group 13 metal, e.g., gallium nitride (GaN), aluminum nitride (AlN), and indium nitride (InN) and also by crystals that contain two or more species of Periodic Table Group 13 metals, e.g., gallium indium nitride (GaInN) and gallium aluminum nitride (GaAlN). While the Periodic Table Group 13 metal nitride semiconductor crystal of the present invention is a crystal obtained by epitaxial growth on a base substrate whose main surface is a nonpolar plane and/or semipolar plane, there are also no particular limitations on the type of base substrate that is used for the epitaxial growth. The type of base substrate is described below.

The Periodic Table Group 13 metal nitride semiconductor crystal of the present invention is a Periodic Table Group 13 metal nitride semiconductor crystal obtained by epitaxial growth on a base substrate whose main surface is a nonpolar plane and/or semipolar plane, and an example of a specific aspect is a gallium nitride crystal obtained by the epitaxial growth of a gallium nitride crystal growth layer on a base substrate comprising gallium nitride having a nonpolar plane or semipolar plane as its main surface. This "gallium nitride crystal growth layer" denotes a crystal growth layer grown on a base substrate, but in particular is preferably a growth layer that has grown directly up on the base substrate. This growth layer that has grown directly up on the base substrate denotes a crystal growth layer that has grown in the direction normal to the main surface of the base substrate and excludes crystal growth layers that have grown in a direction parallel to the main surface of the base substrate (i.e., lateral growth sections).

The present inventors have also discovered that, when the specific condition described below is satisfied by the results of cryogenic PL measurements on a gallium nitride crystal obtained by the epitaxial growth of a gallium nitride crystal growth layer on a base substrate comprising gallium nitride whose main surface is a nonpolar plane or a semipolar plane, such a gallium nitride crystal is then a high-quality gallium nitride that has very few stacking faults, and this gallium nitride is an aspect of the present invention (and is also referred to herebelow as the "gallium nitride according to the present invention").

condition: the gallium nitride crystal growth layer has an emission intensity ratio of the emission at 3.41 eV to the band edge emission (NBE peak), as measured by a cryogenic PL measurement, of not greater than 0.1.

Thus, the extent to which impurities and defects are present in a crystal can be measured by cryogenic PL measurements, and the present inventors have found that a high-quality gallium nitride having very few stacking faults is obtained when the ratio of the emission intensity for the emission at 3.41 eV, which is thought to originate with stacking faults, to the emission intensity for the band edge emission (NBE peak) of gallium nitride—is not greater than 0.1. This is explained below using the figures.

Figure 4:
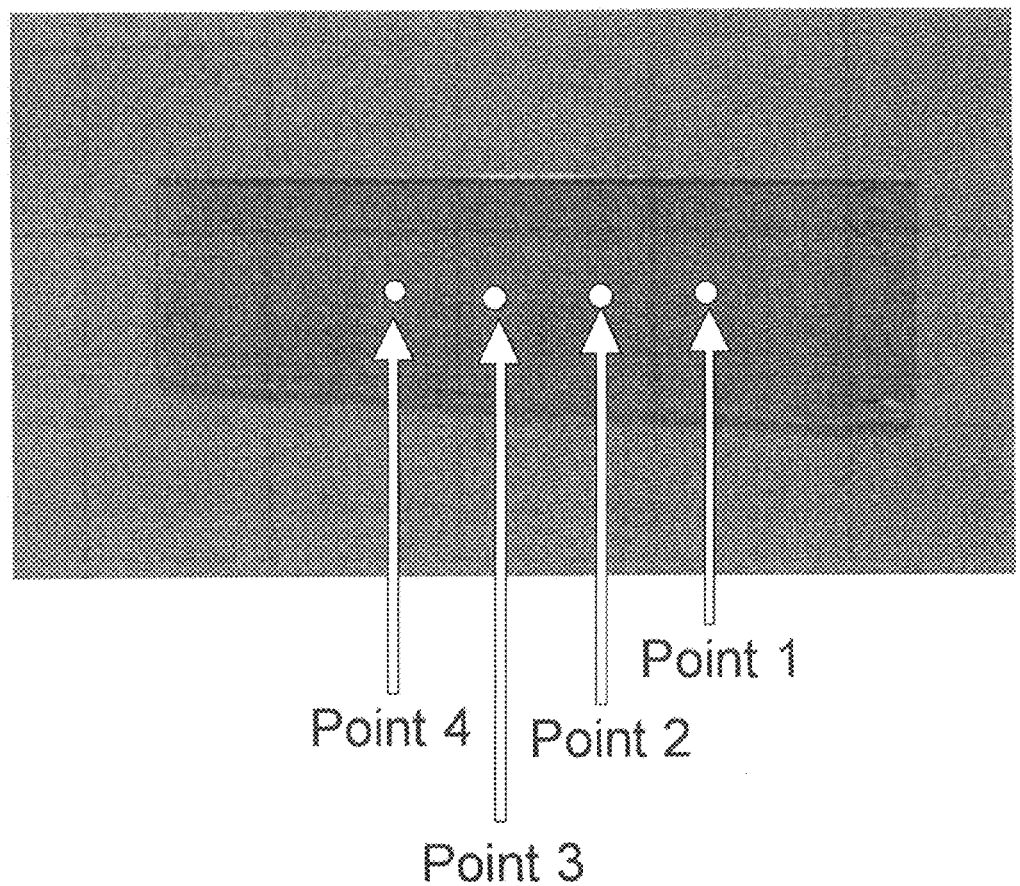
FIG. 4 is a seed substrate used in the examples of the present invention (photograph in lieu of drawing)

FIG. 4 is a GaN seed substrate used in the examples of the present invention. Cryogenic PL measurements were carried out on this GaN seed substrate at the four locations shown in FIG. 4 (Point 1 to Point 4). The spectra obtained by cryogenic PL measurements at Point 1 to Point 4 are plotted in the graph given in FIG. 5.

Figure 5:
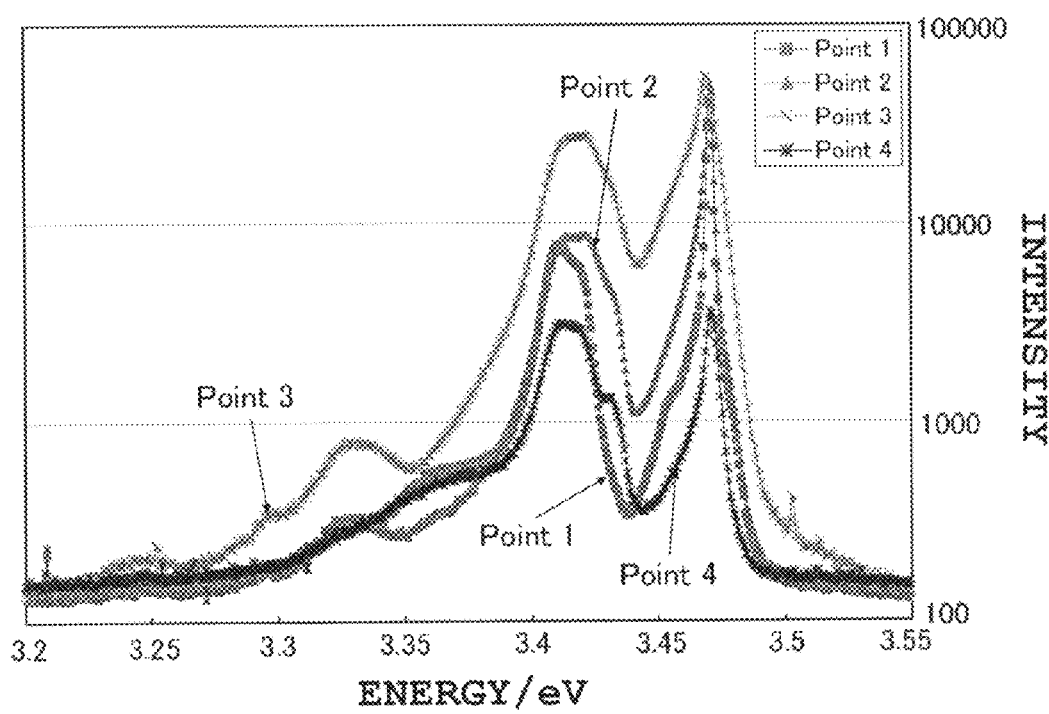
FIG. 5 is a graph that shows the results of cryogenic PL measurements on a seed substrate used in the examples of the present invention.

In FIG. 5, the spectrum for each Point has a sharp peak in the vicinity of 3.47 eV, and this peak is the band edge emission (NBE peak) for gallium nitride. In addition, a gentle peak is present in the vicinity of 3.41 eV, and this peak is a BSF peak, which is thought to originate with stacking faults present in the crystal.

Low temperature PL measurement is carried out using a He—Cd laser having a center wavelength of 325 nm as the excitation light source. The measurement temperature is not strictly limited, but the measurement is preferably performed at 20 K or below. Instrumentation capable of performing PL measurements under such conditions can be exemplified by the combination of a series 74 He—Cd laser from the Omnichrome Corporation, a SpectraPro 2300i spectrograph from Acton, and a PI-MAX1024HQ-Blu CCD detector from Princeton Instruments.

When a crystal has a high carrier concentration in the crystal, an adequate intensity in the PL spectrum may not be obtained when a cryogenic PL measurement is performed and an evaluation may then not be possible. In such a case, the measurement may be performed after the effect of the carrier in the cryogenic PL measurement has been reduced by layering undoped GaN (i-GaN), using, e.g., an MOCVD method, on the crystal surface to be measured. The thickness of the layered-on i-GaN layer will generally be at least 0.01 µm and is more preferably at least 0.1 µm and is even more preferably at least 0.5 µm and will generally be not more than 100 µm and is more preferably not more than 10 µm and is even more preferably not more than 5 µm. When the layered-on i-GaN layer is too thin, the influence of the carrier cannot be adequately reduced; when it is too thick, the effects of defects produced in the layered-on i-GaN layer will then be detected.

The emission intensity ratio of the emission at 3.41 eV to the band edge emission (NBE peak) for the gallium nitride crystal growth layer in the gallium nitride crystal according to the present invention is preferably not greater than 0.1, more preferably not greater than 0.05, and even more preferably not greater than 0.01.

The stacking fault population can vary as a function of the location in the crystal in gallium nitride crystals. In an aspect of the present invention, while the previously described emission intensity ratio of the emission at 3.41 eV to the band edge emission (NBE peak) as measured by cryogenic PL measurements should be satisfied in at least a portion of the crystal, the site satisfying this emission intensity ratio is preferably continuously present in an at least 10 mm$^2$ range and more preferably is present in an at least 100 mm$^2$ range.

A more preferred aspect of the gallium nitride crystal according to the present invention is a gallium nitride crystal for which the emission intensity ratio of the emission at 3.41 eV to the band edge emission (NBE peak) of the base substrate comprising gallium nitride is at least 0.1 as measured by a cryogenic PL measurement.

In the case of conventional crystal growth on a base substrate that has stacking faults, the stacking faults propagate into the grown crystal layer and as a consequence stacking faults in the crystal growth layer are generally more numerous than the stacking faults in the base substrate. With the gallium nitride crystal of the present invention, propagation of the stacking faults present in the base substrate does not occur and the stacking fault population is either maintained as is or is reduced and a crystal growth layer having few stacking faults is obtained from the outset, i.e., in a preferred aspect the aforementioned emission intensity ratio is not more than 0.1 for the crystal growth layer even when this emission intensity ratio measured on the base substrate by cryogenic PL measurement is at least 0.1.

The emission intensity ratio by cryogenic PL measurement for the base substrate may be larger than 0.1 and may be greater than or equal to 0.5.

The thickness of the gallium nitride crystal growth layer is preferably at least 10 µm for the gallium nitride according to the present invention. A thickness for the crystal growth layer of at least 10 µm makes possible use as a substrate for producing light-emitting devices and use as a substrate for producing semiconductor devices. The thickness of the growth layer is more preferably 50 µm or more and even more preferably 100 µm or more.

The main surface of the base substrate for the gallium nitride according to the present invention is a nonpolar plane or semipolar plane, but is preferably a nonpolar plane and particularly preferably is the M-plane.

<Methods of Producing the Periodic Table Group 13 Metal Nitride Semiconductor Crystal>

There are no particular limitations on the method of producing the Periodic Table Group 13 metal nitride semiconductor crystal of the present invention as long as a Periodic Table Group 13 metal nitride semiconductor crystal having the characteristic features described hereabove is produced, and a known growth method and conditions can be adopted as appropriate, for example, vapor-phase growth methods such as hydride vapor-phase growth methods (HVPE methods), metal-organic chemical vapor deposition methods (MOCVD methods), metal-organic chloride vapor-phase growth methods (MOC methods), and sublimation methods, and liquid-phase growth methods such as melt growth, high-pressure solution methods, flux methods, and ammonothermal methods. However, the Periodic Table Group 13 metal nitride semiconductor crystal of the present invention is characterized by having an Si concentration in the crystal that is higher than the O concentration, and, in order to obtain such a Periodic Table Group 13 metal nitride semiconductor crystal, for example, the growth method and conditions are preferably adopted•implemented considering at least one feature selected from the group consisting of the following (A) to (C).

(A) The incorporation, in the atmosphere that brings about the epitaxial growth of the Periodic Table Group 13 metal nitride semiconductor crystal, of a component that removes and/or scavenges the oxygen ($O_2$) and/or oxygenated compounds (for example, $H_2O$, $SiO_2$) present therein as impurities.

(B) The adoption of a growth method in which epitaxial growth proceeds via an equilibrium reaction that produces a secondary product and the execution of epitaxial growth while regulating the concentration of the secondary product in the atmosphere.

(C) The execution of epitaxial growth using a solution or a melt in which an Si-containing component readily dissolves.

(A) is implemented in order to remove and/or scavenge impurity oxygen and/or oxygenated compounds in the growth atmosphere that are a cause of oxygen doping. As previously indicated, oxygen doping can be produced from the impurity oxygen and/or oxygenated compounds present in the growth atmosphere, and a crystal having a higher Si concentration than O concentration can be readily formed by the incorporation in the growth atmosphere of a component that removes and/or scavenges the impurity oxygen and/or oxygenated compounds. There are no particular limitations on the species of the component that removes and/or scavenges impurity oxygen and/or oxygenated compounds, and this component can be exemplified by hydrogen; ammonia; hydrocarbons such as $CH_4$, $C_2H_6$, and $C_3H_8$; carbon; metals such as alkali metals, alkaline-earth metals, and transition metals, e.g., Cu, Ti, and so forth; alloys of the preceding metals; nitrides of the preceding metals; and carbides of the preceding metals. The impurity oxygen and/or oxygenated compounds can be removed and/or scavenged by successively supplying the component for removing and/or scavenging impurity oxygen and/or oxygenated compounds into the gas phase and/or liquid phase in the growth atmosphere or by introducing the required amount of this component into the reaction vessel in advance.

The "growth method in which epitaxial growth proceeds via an equilibrium reaction that produces a secondary product" of (B) can be exemplified by a growth method that utilizes, for example, an alkali metal (Periodic Table Group 1 metal) and/or an alkaline-earth metal (Periodic Table Group 2 metal). In order to relax the conditions for growing the Periodic Table Group 13 metal nitride semiconductor crystal, this growth method characteristically proceeds through a complex nitride that contains a Periodic Table Group 13 metal and a Periodic Table Group 1 metal and/or a Periodic Table Group 2 metal: for example, crystal growth proceeds by a reaction as shown in equation (1) below and a nitride of the Periodic Table Group 1 metal and/or Periodic Table Group 2 metal is produced as a secondary product.

[C1]

(1)

($M^1$: Periodic Table Group 1 metal, $M^{13}$: Periodic Table Group 13 metal)

In this growth method, the growth rate can be suitably regulated through the reversibility of the formation and decomposition of the Periodic Table Group 13 metal nitride semiconductor crystal and a Periodic Table Group 13 metal nitride semiconductor crystal having few crystal defects, e.g., dislocations, voids, stacking faults, and so forth, can then be formed. Crystal defects are characteristically prone to incorporate dopants such as oxygen, and high-defect crystals thus naturally tend to also have higher O concentrations. Accordingly, a crystal having an Si concentration that is higher than its O concentration can be readily formed by adopting the growth method under consideration. The "regulating the concentration of the secondary product in the atmosphere" thus denotes regulating the growth rate by regulating the concentration of the secondary product (for example, $M^1_3N$). The method of regulating the secondary product concentration is not particularly limited and can be exemplified by a method in which the concentration of the secondary product is regulated by feeding a component that decomposes the secondary product into the growth atmosphere.

A basic solution or basic melt is an example of the solution or melt in which an Si-containing component readily dissolves in (C). The basic solution or basic melt can be exemplified by an alloy melt or molten salt in which the nitride of a Periodic Table Group 1 metal and/or a Periodic Table Group 2 metal has been dissolved.

As explained above at a general level, a Periodic Table Group 13 metal nitride semiconductor crystal in which the Si concentration within the crystal is higher than the O concentration can be obtained by adopting•implementing the growth method and conditions considering at least one feature selected from the group consisting of (A) to (C), but a liquid-phase growth method that incorporates at least one feature selected from the group consisting of (A) to (C) will be described in the following as a specific example. This production method can efficiently produce a good-quality Periodic Table Group 13 metal nitride semiconductor crystal of the present invention and is one aspect of the present invention.

The method of the present invention for producing the Periodic Table Group 13 metal nitride semiconductor crystal (also referred to herebelow as the "production method of the present invention") comprises the steps (1) and (2) described below wherein a starting material is a complex nitride of a Periodic Table Group 13 metal and a Periodic Table Group 1 metal and/or a Periodic Table Group 2 metal.

(1) A step of preparing a solution or a melt containing a starting material and a solvent.

(2) A growth step of epitaxially growing, in the presence of a liquid phase that is a solution or a melt and in the presence of a gas phase that has the hydrogen molecule and/or a hydride, a Periodic Table Group 13 metal nitride semiconductor crystal in the liquid phase.

In addition, the method of the present invention for producing a Periodic Table Group 13 metal nitride semiconductor crystal may comprise the following steps (1') and (2').

(1') A step of preparing a solution or a melt containing a starting material and a solvent.

(2') A growth step of epitaxially growing, in the presence of a liquid phase that is a solution or melt and in the presence of a gas phase having hydrogen and nitrogen, a Periodic Table Group 13 metal nitride semiconductor crystal in the liquid phase.

The step in the production method of the present invention of preparing a solution or a melt containing starting material and a solvent denotes a step in which a solution or melt serving as the liquid phase used for epitaxial growth is prepared in a stage that precedes the growth step in which the crystal is formed. For example, the step of preparing a solution or melt also includes a process of dissolving the starting material in a solvent, or, in those instances in which the compound forming the solvent is a solid at normal temperature, a process of preparing a melt by, for example, heating. However, the solution or melt containing a starting material and solvent is not necessarily one in which the starting material is completely dissolved in the solvent and may be a heterogeneous system in which a solid starting material is present in the solution as a dispersion or a solid. This step may be carried out in the apparatus of FIG. 3, which is also used for the growth step. For example, the starting material and a compound that will form the solvent may be preliminarily introduced into a reaction vessel 104 and a solution or melt 108 may then be produced by heating a reaction tube 103 using an electric furnace 102.

The growth step in the production method of the present invention of epitaxially growing, in the presence of a liquid phase that is a solution or a melt and in the presence of a gas phase that has the hydrogen molecule and/or a hydride, a Periodic Table Group 13 metal nitride semiconductor crystal in the liquid phase (also referred to herebelow as the "growth step according to the present invention"), denotes a growth step that utilizes a liquid-phase growth method in which the Periodic Table Group 13 metal nitride semiconductor crystal is epitaxially grown in a region surrounded by a liquid phase and further denotes a growth step that has in the reaction system a gas phase that has the hydrogen molecule and/or a hydride, and that utilizes the hydrogen molecule and/or the hydride in the epitaxial growth reaction. In addition, a "gas phase that has the hydrogen molecule and/or a hydride" means that at least the hydrogen molecule ($H_2$) or a hydride such as ammonia ($NH_3$) is present in the gas phase and that a component other than the hydrogen molecule and a hydride, for example, a component such as the nitrogen molecule ($N_2$), may also be present. The growth step in the production method of the present invention of epitaxially growing, in the presence of a liquid phase that is a solution or a melt and in the presence of a gas phase that has hydrogen, a Periodic Table Group 13 metal nitride semiconductor crystal in the liquid phase, denotes a growth step that utilizes a liquid-phase growth method in which the Periodic Table Group 13 metal nitride semiconductor crystal is epitaxially grown in a region surrounded by a liquid phase and further denotes a growth step that has in the reaction system a gas phase having hydrogen and nitrogen and that utilizes the hydrogen and nitrogen in the epitaxial growth reaction. In addition, the "liquid phase that is a solution or a melt" in the growth step according to the present invention is not necessarily identical to the "solution or melt" in the aforementioned step of preparing a solution or a melt. While the "solution or melt" in the step of preparing a solution or a melt is prepared for use in the growth step, the "solution or melt" in the growth step may contain secondary products produced by the epitaxial growth reaction and thus is not necessarily the same as the initial (before the start of epitaxial growth) composition.

Figure 3:
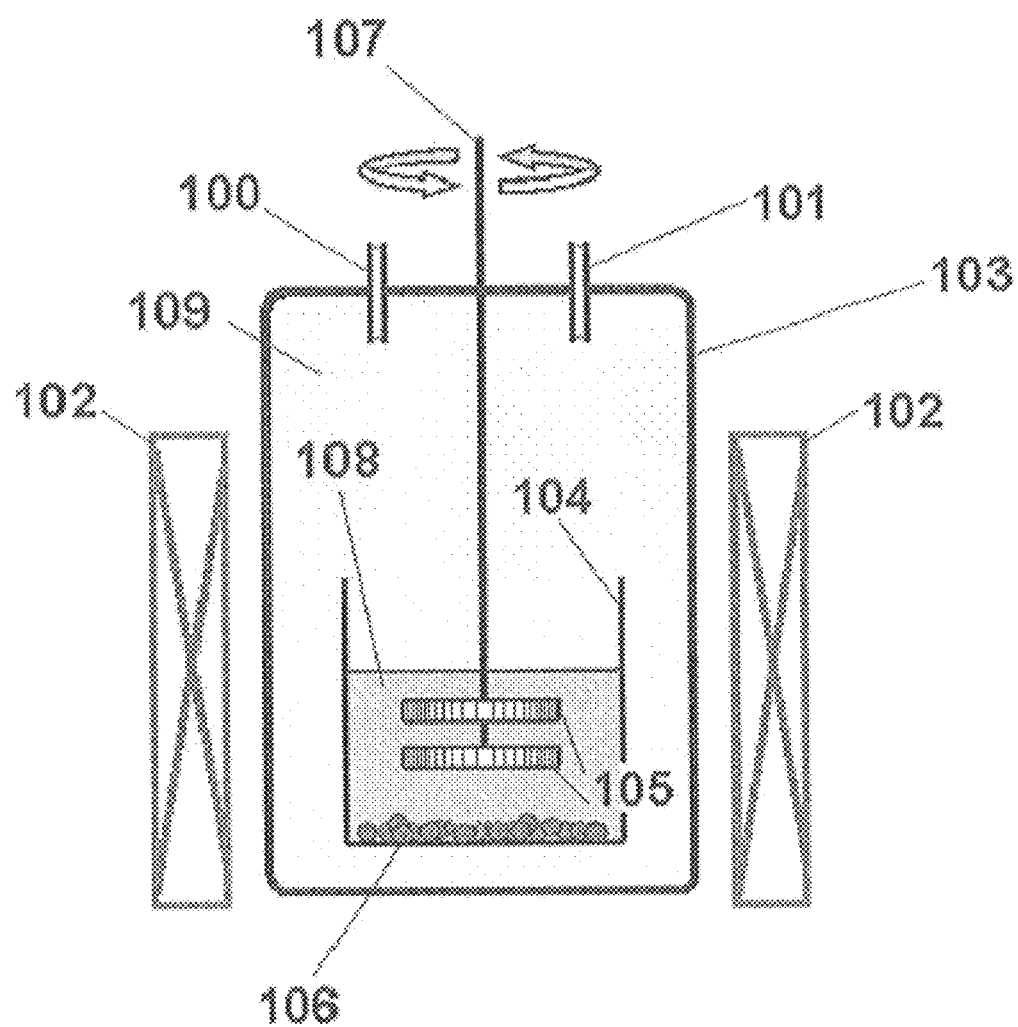
FIG. 3 is a schematic diagram of a production apparatus used in the production method of the present invention.

The growth step according to the present invention is described in detail below using the example of the production of gallium nitride and with reference to a schematic diagram (FIG. 3) of the apparatus used in the growth step. In FIG. 3, 104 indicates a reaction vessel; 108 indicates an LiCl molten salt that is the solvent; 106 indicates an $Li_3GaN_2$ complex nitride (solid) that functions as the starting material; and 105 indicates a gallium nitride crystal that is the base substrate. The growth step according to the present invention is characterized by the presence of a gas phase 109 containing hydrogen and nitrogen and a liquid phase 108 comprising a solution or a melt.

The $Li_3GaN_2$ complex nitride in the "liquid phase that is a solution or a melt" (the $Li_3GaN_2$ complex nitride is believed to form a complex salt with $Li_3N$ and dissolve) reaches the surface of the base substrate that is similarly present in the liquid phase and crystal growth then proceeds by the equilibrium reaction shown in the following equation (2).

[C2]

$$Li_3GaN_2 \rightleftharpoons GaN + Li_3N \qquad (2)$$

In addition, the hydrogen molecule or hydride in the "gas phase that has the hydrogen molecule and/or a hydride", either directly or upon dissolving in the liquid phase, hydrogenates (nitridation can also occur by action together with a nitrogen source present in the liquid phase or gas phase) the $Li_3N$ produced according to equation (2) to produce lithium hydride, lithium imide, or lithium amide. The hydrogen and nitrogen in the "gas phase having hydrogen and nitrogen" may hydrogenate and/or nitridate, either directly or upon dissolving in the liquid phase, the $Li_3N$ produced according to equation (2) to produce lithium hydride, lithium imide, or lithium amide. For example, lithium amide ($LiNH_2$) is produced by the reactions given in equations (3) and/or (4) below. An increase in the $Li_3N$ concentration in the vicinity of the gallium nitride crystal causes a lowering of the growth rate, while a rapid lowering of the $Li_3N$ concentration is also associated with rapid GaN production and causes the production of miscellaneous crystals and/or a reduction in the crystallinity. The hydrogen molecule and the hydride function to suitably regulate the growth rate and are particularly important for obtaining a Periodic Table Group 13 metal nitride semiconductor crystal in which the Si concentration is higher than the O concentration. In addition, the hydrogen and nitrogen also function to suitably regulate the growth rate and are particularly important for obtaining a semiconductor crystal in which the Si concentration is higher than the O concentration. The reactions that produce lithium hydride, lithium imide, and lithium amide are all equilibrium reactions, and the $Li_3N$ concentration can thus be regulated through the concentration of the hydrogen molecule or hydride; similarly, the $Li_3N$ concentration can also be regulated through the hydrogen and nitrogen concentration.

[C3]

$$Li_3N + 3H_2 + N_2 \rightleftharpoons 3LiNH_2 \qquad (3)$$

$$Li_3N + 2NH_3 \rightleftharpoons 3LiNH_2 \qquad (4)$$

The growth methods and conditions for obtaining a Periodic Table Group 13 metal nitride semiconductor crystal having an Si concentration within the crystal higher than the O concentration have been described above, and the growth step according to the present invention satisfies all of the features (A) to (C) listed above. The hydrogen or hydride in the "gas phase that has the hydrogen molecule and/or a hydride" corresponds to the component that scavenges impurity oxygen of (A) and functions to decompose and remove the impurity oxygen. In addition, the hydrogen molecule or hydride functions, as shown in equations (3) and (4), to regulate secondary product concentration in accordance with (B). That is, the "gas phase that has the hydrogen molecule and/or a hydride" can be regarded as an important factor in the growth step for producing the Periodic Table Group 13 metal nitride semiconductor crystal of the present invention having an Si concentration higher than the O concentration. Moreover, the molten salt in which $Li_3N$ is dissolved is a solution or melt in which an Si-containing component readily dissolves and thus functions according to (C). Similarly, the hydrogen in the "gas phase having hydrogen and nitrogen" corresponds to the component that scavenges impurity oxygen of (A) and functions to decompose and remove the impurity oxygen. The hydrogen and nitrogen function, as shown in equation (3), to regulate secondary product concentration in accordance with (B). That is, the "gas phase having hydrogen and nitrogen" can be regarded as an important factor in the growth step for producing the Periodic Table Group 13 metal nitride semiconductor crystal having an Si concentration higher than the O concentration. Moreover, the molten salt in which $Li_3N$ is dissolved is a solution or melt in which an Si-containing component readily dissolves and thus functions according to (C).

[The Starting Material]

The starting material used in the production method of the present invention can be established as appropriate in conformity with the intended Periodic Table Group 13 metal nitride semiconductor crystal. For example, a complex nitride between a Periodic Table Group 13 metal and a Period Table Group 1 metal and/or a Periodic Table Group 2 metal, such as the $Li_3GaN_2$ complex nitride cited above, is an example of a favorable starting material. In addition to Ga, the Periodic Table Group 13 metals can be exemplified by Al, In, GaAl, and GaIn, while the Periodic Table Group 1 metals and/or Periodic Table Group 2 metals that can be used as a starting material can be exemplified by Na, Ca, Sr, Ba, and Mg in addition to Li. Thus, in addition to $Li_3GaN_2$, the complex nitride between a Periodic Table Group 13 metal and a Period Table Group 1 metal and/or a Periodic Table Group 2 metal can be exemplified by $Ca_3Ga_2N_4$, $Ba_3Ga_2N_4$, and $Mg_3GaN_3$. The complex nitride containing a Periodic Table Group 13 metal and a Periodic Table Group 1 metal and/or a Periodic Table Group 2 metal can be prepared, for example, by a method in which a powder of a Periodic Table Group 13 metal nitride is mixed with a powder of a Periodic Table Group 1 metal and/or a Periodic Table Group 2 metal nitride (for example, $Li_3N$, $Ca_3N_2$) followed by raising the temperature and carrying out a solid-phase reaction, and by a method in which an alloy containing a Periodic Table Group 13 metal and a Periodic Table Group 1 metal and/or a Periodic Table Group 2 metal is prepared and heated in a nitrogen atmosphere. For example, $Li_3GaN_2$ can be prepared by heating a Ga—Li alloy at 600° C. to 800° C. in a nitrogen atmosphere.

When a starting material is a solid under the conditions in the growth step, this solid starting material need not be completely dissolved in the solvent. Even when a portion is present undissolved in the reaction vessel, the portion consumed by crystal growth will be supplied into the solvent as necessary. The amount of starting material relative to the solvent is not particularly limited and can be established as appropriate in conformity with the goal, but, expressed with reference to the liquid phase, will generally be at least 2 mass % and is preferably at least 5 mass % and more preferably at least 10 mass % and will generally be not more than 50 mass % and is preferably not more than 30 mass % and more preferably not more than 20 mass %. When this range is obeyed, the efficiency for continuous production can be raised and space within the reaction vessel can also be ensured.

The growth step according to the present invention is characteristically carried out "in the presence of a gas phase that has the hydrogen molecule and/or a hydride", but there are no particular limitations on the specific type of hydride, on the concentration in the gas phase of the hydrogen molecule and/or hydride, and so forth. The hydride can be exemplified by ammonia ($NH_3$), methane ($CH_4$), and ethane ($C_2H_6$) with ammonia ($NH_3$) being particularly preferred. As noted above, a component other than the hydrogen molecule and a hydride may be present in the gas phase; for example, the nitrogen molecule ($N_2$) may also be present. The conditions, e.g., the concentration and so forth, are described in detail below for each of the following: the case in which the hydrogen molecule ($H_2$) is present; the case in which ammonia ($NH_3$) is present; and the case in which nitrogen ($N_2$) is present.

When the hydrogen molecule ($H_2$) is present, the $H_2$ concentration in the gas phase will generally be at least 0.001 mol % and is preferably at least 0.1 mol % and more preferably at least 1 mol % and will generally be not more than 99.9 mol % and is preferably not more than 99 mol % and more preferably not more than 90 mol %.

When ammonia ($NH_3$) is present, the $NH_3$ concentration in the gas phase will generally be at least 0.001 mol % and is preferably at least 0.01 mol % and more preferably at least 0.1 mol % and will generally be not more than 99.9 mol % and is preferably not more than 99 mol % and more preferably not more than 90 mol %.

When the nitrogen molecule ($N_2$) is present, the $N_2$ concentration in the gas phase will generally be at least 0.1 mol % and is preferably at least 1 mol % and more preferably at least 10 mol % and will generally be not more than 100 mol % and is preferably not more 99.9 mol % and more preferably not more than 99 mol %.

These components, in addition to being introduced into the gas phase in advance, may be successively supplied during crystal growth.

The feed flow rate in the event of the successive supply of hydrogen gas ($H_2$), expressed as the amount converted to normal temperature and normal pressure, will generally be at least 0.0001 L/min and is preferably at least 0.001 L/min and more preferably at least 0.01 L/min and will generally be not more than 10 L/min and is preferably not more than 5 L/min and more preferably not more than 1 L/min.

The feed flow rate in the event of the successive supply of ammonia gas ($NH_3$) will generally be at least 0.0001 L/min and is preferably at least 0.001 L/min and more preferably at least 0.01 L/min and will generally be not more than 10 L/min and is preferably not more than 5 L/min and more preferably not more than 1 L/min.

The feed flow rate in the event of the successive supply of the nitrogen molecule ($N_2$), expressed as the amount converted to normal temperature and normal pressure, will generally be at least 0.001 L/min and is preferably at least 0.01 L/min and more preferably at least 0.1 L/min and will generally be not more than 100 L/min and is preferably not more than 50 L/min and more preferably not more than 10 L/min.

In the event of the successive supply of a mixed gas of hydrogen gas ($H_2$) and nitrogen gas ($N_2$) ($H_2$: 10 vol %), it will generally be at least 0.001 L/min and is preferably at least 0.01 L/min and more preferably at least 0.1 L/min and will generally be not more than 100 L/min and is preferably not more than 50 L/min and more preferably not more than 10 L/min.

In the event of the successive supply of a mixed gas of ammonia gas ($NH_3$) and nitrogen gas ($N_2$) ($NH_3$: 2.7 vol %), it will generally be at least 0.001 L/min and is preferably at least 0.01 L/min and more preferably at least 0.1 L/min and will generally be not more than 100 L/min and is preferably not more than 50 L/min and more preferably not more than 10 L/min.

The Periodic Table Group 13 metal nitride semiconductor crystal of the present invention can be efficiently produced when these ranges are observed.

[The Solvent]

There are no particular limitations on the solvent used in the production method of the present invention, but a solvent is preferred in which the main component is a metal salt. The content of the metal salt is preferably 50% by mass or more, more preferably 70% by mass or more, and further preferably 90% by mass or more. A molten salt provided by melting a metal salt is particularly preferred for use as the solvent.

The metal salt species should not impair crystal growth, but is not otherwise particularly limited and can be exemplified by halides, carbonates, nitrates, and sulfides, e.g., alkali metal salts with Li, Na, K, and so forth and/or alkaline-earth metal salts with Mg, Ca, Sr, and so forth. Specifically, metal halides such as LiCl, KCl, NaCl, $CaCl_2$, $BaCl_2$, CsCl, LiBr, KBr, CsBr, LiF, KF, NaF, LiI, NaI, $CaI_2$, and $BaI_2$ are preferred and LiCl, KCl, NaCl, CsCl, $CaCl_2$, and $BaCl_2$ are particularly preferred. The metal salt species is not limited to a single species and a suitable combination of a plurality of metal salt species may be used. More preferred thereamong is the co-use of a lithium halide with another metal salt. The proportion of the lithium halide is preferably at least 30% of the metal salt as a whole and is more preferably at least 80% of the metal salt as a whole.

In addition, for example, the nitride of a Periodic Table Group 1 metal or Periodic Table Group 2 metal, e.g., $Li_3N$, $Ca_3N_2$, $Mg_3N_2$, $Sr_3N_2$, $Ba_3N_2$, and so forth, is preferably included in the solvent in order to raise the solubility of the complex nitride containing a Periodic Table Group 13 metal and a Periodic Table Group 1 metal and/or Periodic Table Group 2 metal.

Metal salts may contain a substantial moisture fraction since they are typically strongly hygroscopic. Impurities that can function as an oxygen source, e.g., moisture, must be eliminated to the greatest extent possible in order to produce the Periodic Table Group 13 metal nitride semiconductor crystal of the present invention, and thus a preliminary purification of the solvent is preferably performed. There are no particular limitations on the purification method, and it can be exemplified by a method in which a reactive gas is blown into the solvent using the apparatus described in Japanese Patent Application Laid-open No. 2007-084422. For example, when the solvent is a metal salt that is solid at normal temperature, impurities such as moisture can be removed by heating and melting and blowing in and bubbling with a reactive gas such as hydrogen chloride, hydrogen iodide, hydrogen bromide, ammonium chloride, ammonium bromide, ammonium iodide, chlorine, bromine, iodine, and so forth. The use of hydrogen chloride with a chloride molten salt is particularly preferred.

[The Reaction Vessel]

There are no particular limitations on the configuration of the reaction vessel used to hold the liquid phase, and it may be established as appropriate in conformity with the objective. The material of the reaction vessel should not impede the reactions in the production method of the present invention, but is not otherwise particularly limited; however, a metal, oxide, nitride, or carbide that is thermally and chemically stable is preferably the main component. A metal containing a Periodic Table Group 4 element (Ti, Zr, Hf) is favorable, while the use of Ti is preferred.

The material of the reaction vessel is preferably a material that is highly processable and strongly mechanically durable, and the use of a metal that is at least 90 mass % of the aforementioned Group 4 element is more preferred. The use of a metal that is at least 99 mass % of such a Group 4 element is even more preferred. The surface of such a reaction vessel is preferably constituted of a nitride of a Periodic Table Group 4 element, and the formation of a nitride in advance by a nitriding treatment method as described below is favorable.

[The Method of Nitriding a Member]

In addition to its execution on the reaction vessel described above, the nitriding treatment described below is preferably carried out in advance on members used in the growth step in which the Periodic Table Group 13 metal nitride semiconductor crystal is epitaxially grown, for example, stirring blades, seed crystal support rods, seed crystal support platforms, baffles, gas introduction tubes, valves, and so forth, in order to form a strong and stable nitride on surfaces in contact with the liquid or melt. The nitride may be formed as a nitride film in order to maintain the processability and mechanical durability.

There are no particular limitations on the nitriding treatment method as long as the nitride thereby formed on the surface is stable. For example, a stable nitride film can be formed on the surface of a member of the reaction vessel by heating and holding the member in a nitrogen atmosphere at 700° C. or above.

In addition, the surface of a member may also be nitrided using an alkali metal nitride and/or an alkaline-earth metal nitride as a nitriding agent at high temperatures, and a stable nitride film can be formed preferably by holding in a mixed melt of an alkali metal halide and/or an alkaline-earth metal halide+an alkali metal nitride and/or an alkaline-earth metal nitride. The nitriding treatment may also be conveniently carried out by holding the member under the same conditions as the conditions under which crystal growth is actually performed.

[The Base Substrate (Seed)]

In order to obtain a crystal with an industrially acceptable size, a base substrate is preferably disposed in the liquid phase in which the epitaxial growth is performed. A crystal of the target Periodic Table Group 13 metal nitride crystal, e.g., gallium nitride (GaN), indium gallium nitride (InGaN), aluminum gallium nitride (AlGaN), and so forth, can be used for the base substrate, as can a metal oxide, e.g., sapphire, zinc oxide (ZnO), beryllium oxide (BeO), and so forth; a silicon-containing material such as silicon carbide (SiC) and silicon (Si); or GaAs. A Periodic Table Group 13 metal nitride semiconductor crystal is most preferred when one considers matching with the Periodic Table Group 13 metal nitride semiconductor crystal that is grown in the present invention. The shape of the base substrate is also not particularly limited and it may be a flat plate or a rod. When a rod-shaped base substrate is used, a bulk crystal can also be produced by growing initially at the base substrate part and then carrying out crystal growth in the perpendicular direction while also carrying out crystal growth in the horizontal direction. In order to efficiently grow the Periodic Table Group 13 metal nitride semiconductor crystal on the base substrate, it is preferred that miscellaneous crystals neither grow nor attach around the base substrate. A miscellaneous crystal is a small-diameter crystal that grows at a location outside the base substrate, and, when miscellaneous crystals are present in the vicinity of the base substrate, the Periodic Table Group 13 metal nitride component in the liquid phase will then be spit between growth on the base substrate and growth of the miscellaneous crystals and an adequate growth rate for the Periodic Table Group 13 metal nitride semiconductor crystal on the base substrate will not be obtained.

[Temperature, Pressure, and Other Conditions]

In the growth step, the growth temperature in growing the Periodic Table Group 13 metal nitride semiconductor crystal in a reaction vessel is generally 200° C. or higher, preferably 400° C. or higher, and more preferably 600° C. or higher and generally 1000° C. or lower, preferably 850° C. or lower, and more preferably 800° C. or lower.

The pressure within the reaction vessel during growth of the Periodic Table Group 13 metal nitride crystal in this growth step can be selected as appropriate as a function of the conditions and is not particularly limited; however, to enable an industrially advantageous production with a simple production apparatus, it is generally not more than 10 MPa and is preferably not more than 3 MPa, more preferably not more than 0.3 MPa, and even more preferably not more than 0.11 MPa and is generally at least 0.01 MPa and is more preferably at least 0.09 MPa.

The growth rate for crystal growth can be regulated using, for example, the temperature and pressure as described above and is not particularly limited, but will generally be at least 0.1 µm/h and is preferably at least 1 µm/h or at least 10 µm/h and will generally be not more than 1000 µm/h. For the present invention, the growth rate can be determined by dividing the thickness—as calculated by converting the amount of increase in the grown crystal—by the growth step execution time.

Stirring of the liquid phase is desirable in order to uniformly distribute the starting material in the liquid phase. There are no particular limitations on the stirring method, which can be exemplified by methods in which stirring is performed by rotating the seed crystal, methods in which stirring is performed by inserting and rotating stirring blades, methods in which a gas is bubbled into the liquid phase, and methods in which stirring is performed using a liquid transport pump.

The other conditions in the growth step according to the present invention are not particularly limited, and the techniques used in liquid-phase growth methods, e.g., flux methods and so forth, may be adopted as appropriate and used in the growth step of the present invention. Specific examples are the gradient transport method, slow cooling method, temperature cycling method, accelerated crucible rotation method, top-seeded solution growth method, and traveling solvent method and its traveling-solvent floating-zone variant, which are used mainly in flux methods; evaporation methods; and methods provided by any combination of the preceding methods.

In addition to the steps that have already been described in the preceding, the production method of the present invention may also include, inter alia, a slicing step in which the obtained crystal is sliced to a desired size and a surface polishing step in which the surface is polished. The slicing step can be exemplified by wire slicing and inner diameter saw slicing. The surface polishing step can be exemplified by processes in which the surface is polished using an abrasive such as a diamond abrasive and by chemical mechanical polishing (CMP) and processes in which the damage layer is etched by RIE after mechanical polishing.

The Periodic Table Group 13 metal nitride semiconductor crystal of the present invention can be used in various applications. In particular, the Periodic Table Group 13 metal nitride semiconductor crystal is useful as substrates for manufacturing light emitting elements at relatively short wavelength side, such as ultraviolet to blue light emitting diodes and semiconductor lasers as well as light emitting elements at relatively long wavelength side ranging from green to red, and also useful as substrates of semiconductor devices such as electronic devices.

EXAMPLES

The present invention is described in greater detail by the following examples and comparative examples, but should not be construed as being limited only to the specific embodiments provided in the following examples.

Example 1

The details of Example 1 are described with reference to the schematic diagram of the production apparatus given in FIG. 3.

(1) 2.16 g of $Li_3GaN_2$ (solid) and 28.8 g of LiCl—ground in advance with a tungsten carbide mortar—as the solvent were introduced into a nitrided Ti reaction vessel having an outer diameter of 34 mm, an inner diameter of 30 mm, and a height of 200 mm. The $Li_3GaN_2$ used was $Li_3GaN_2$ having a particle diameter of at least 710 μm and not more than 2 mm as selected using a sieve. The Ti reaction vessel was nitrided by preliminarily introducing 45 g of LiCl and 4.5 g of $Li_3GaN_2$ into the Ti reaction vessel and heating for 60 hours at 745° C. under a nitrogen atmosphere.

(2) The Ti reaction vessel 104 was set in a quartz reaction tube 103 and the gas inlet port 100 and the gas exhaust port 101 of the quartz reaction tube were closed. All of these processes were carried out in an Ar box.

(3) The quartz reaction tube 103 was removed from the Ar box and set in an electric furnace 102. A gas introduction line was connected to this quartz reaction tube 103; the pressure in the introduction line was reduced; the gas inlet port 100 to the quartz reaction tube was then opened and the pressure within the quartz reaction tube 103 was reduced; and this was followed by recovery to atmospheric pressure using a hydrogen/nitrogen mixed gas (5 volume % hydrogen) to establish a hydrogen/nitrogen mixed gas atmosphere within the quartz reaction tube 103. After this, the gas exhaust port 101 of the quartz reaction tube 103 was opened and a hydrogen/nitrogen mixed gas (5 volume % hydrogen) was passed through at 0.3 L/min (value converted to 20° C. and 1 atm) as the amount converted to normal temperature and normal pressure (this throughflow was continued until the experiment was finished).

(4) Heating with the electric furnace was begun and the temperature within the Ti reaction vessel 104 was raised in 1 hour from room temperature to 745° C. The LiCl was melted to form a molten salt and the $Li_3GaN_2$, which was the starting material 106, dissolved in this molten salt to form a solution.

(5) After holding for 7 hours at 745° C., a seed 105 attached at the end of a seed support rod 107 was immersed in the solution 108 in the reaction vessel 104 and the seed was rotated at 100 rpm and crystal growth was started. The following were used for the seed: a GaN substrate (plate shape with a size of 5×8 mm, thickness=800 μm) that had the (10-10) plane, a nonpolar plane, for its main surface and a GaN substrate (plate shape with a size of 5×8 mm, thickness=320 μm) that had the (10-11) plane, a semipolar plane, for its main surface. The substrates were disposed as shown by 105 with the (10-10) plane substrate at the top and the (10-11) plane substrate at the bottom. $Li_3GaN_2$ in the amount in excess of its solubility in the solution was present in solid form at the bottom of the reaction vessel 104.

(6) After crystal growth had been carried out for 40 hours at 745° C., the seed 105 was withdrawn from the solution 108, after which heating with the furnace was halted and the quartz reaction tube 103 was gradually cooled.

(7) The withdrawal of the seed 105 from the quartz reaction tube 103 yielded GaN crystals in which a GaN growth layer had formed on the seed.

(8) The obtained GaN crystal was introduced into hot water in order to dissolve the salt adhering to the crystal. With regard to the GaN crystal mass, the mass of the GaN substrate whose main surface was the (10-10) plane was increased by 4.8 weight % with reference to the mass of the seed prior to crystal growth and the mass of the GaN substrate whose main surface was the semipolar (10-11) plane was increased by 5.8 weight % with reference to the mass of the seed prior to crystal growth, and GaN growth layers of GaN crystal were formed on the main surface of the seeds. The thickness of the GaN growth layers that were formed was 38 μm for the GaN substrate having the (10-10) plane for its main surface and 19 μm for the GaN substrate having the semipolar (10-11) plane for its main surface. The obtained GaN growth layers were colorless and transparent according to visual observations.

The obtained growth layers were submitted to SIMS measurements: the growth layer grown on the (10-10) plane had an Si concentration of $1.8 \times 10^{18}$ cm$^{-3}$, an O concentration at or below the lower detection limit (actually measured value: $2.5 \times 10^{16}$ cm$^{-3}$, lower limit: $3 \times 10^{16}$ cm$^{-3}$), and an Na concentration of $3.2 \times 10^{15}$ cm$^{-3}$, while the growth layer grown on the (10-11) plane had an Si concentration of $3.5 \times 10^{18}$ cm$^{-3}$, an O concentration at or below the lower detection limit (actually measured value: $2.9 \times 10^{16}$ cm$^{-3}$, lower limit: $3 \times 10^{16}$ cm$^3$)) and an Na concentration of $2.2 \times 10^{15}$ cm$^{-3}$.

The full width at half maximum in the rocking curve for the (100) diffraction peak in x-ray diffraction of the growth layer obtained by growth on the (10-10) plane was 22 arcsec for x-rays entering in the direction parallel to the c-axis and was 29 arcsec for x-rays entering in the direction orthogonal to the c-axis. The full width at half maximum in the rocking curve for the (300) diffraction peak measured with x-rays incident in the direction orthogonal to the c-axis was 70 arcsec and the full width at half maximum in the rocking curve for the (102) diffraction peak measured with x-rays incident in the direction orthogonal to the c-axis was 32 arcsec, and these results all indicated a very good crystallinity for the obtained growth layer.

The full width at half maximum in the rocking curve for the (101) diffraction peak in x-ray diffraction of the growth layer obtained by growth on the (10-11) plane was 29 arcsec for x-rays entering in the direction parallel to the c-axis and was 30 arcsec for x-rays entering in the direction orthogonal to the c-axis. The full width at half maximum in the rocking curve for the (100) diffraction peak measured with x-rays incident in the direction orthogonal to the c-axis was 46 arcsec, and these results all indicated a very good crystallinity for the obtained growth layer. 97% of the obtained growth plane was a nonpolar plane or semipolar plane.

Figure 8:
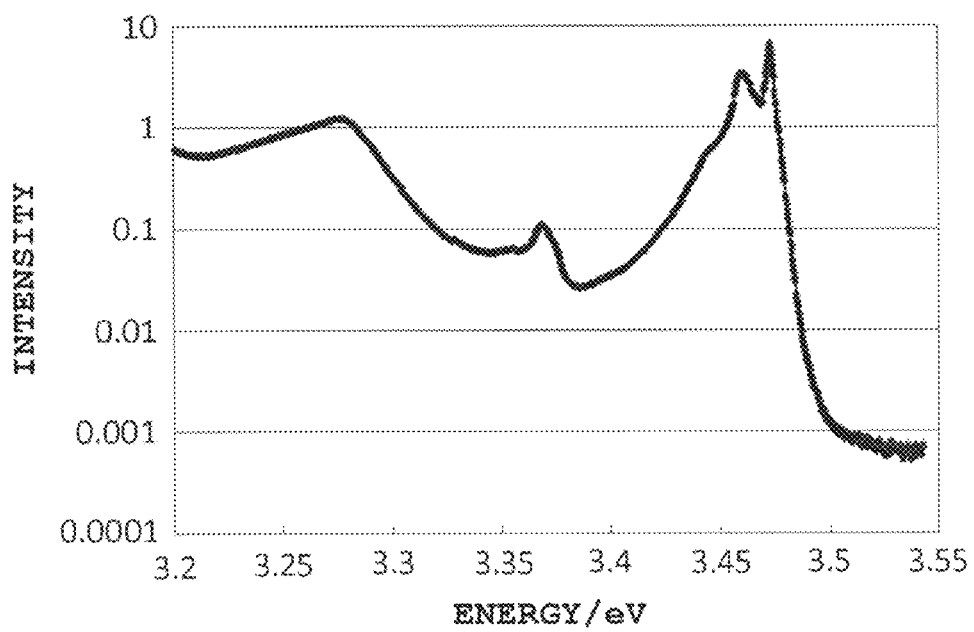
FIG. 8 is a graph that shows the results of a cryogenic PL measurement on the GaN crystal growth layer grown in Example 1.

(9) Low temperature PL measurement of the GaN substrate having the (10-11) plane, which is a semipolar plane, as a principal plane was carried out at a measurement temperature of 13 K using a He—Cd laser having a center wavelength of 325 nm as the excitation light source. The result is shown in FIG. 8. The ratio of the stacking fault-induced PL intensity in the vicinity of 3.41 eV to the band edge PL intensity was 0.008 for the produced GaN crystal growth layers. In addition, according to the results of optical microscopic observations, the surfaces of the GaN crystal growth layers were smooth; the flat region area in the crystal growth layers was 45 mm$^2$ as a whole; and the continuous flat region range was also 45 mm$^2$.

Example 2

(1) 1.5 g of solid Li$_3$GaN$_2$ was introduced into a nitrided titanium (Ti) reaction vessel having an outer diameter of 34 mm, an inner diameter of 30 mm, and a height of 200 mm, and 45 g of LiCl was then introduced—after grinding with a tungsten carbide mortar—into the reaction vessel as the solvent. The solid Li$_3$GaN$_2$ used was Li$_3$GaN$_2$ having a particle diameter of at least 710 μm and not more than 2 mm as selected using a sieve. The Ti reaction vessel was nitrided by heating for 60 hours at 800° C. under a nitrogen atmosphere. The reaction vessel and a seed support rod made of tungsten and bearing a GaN seed were then set into a quartz reaction tube and the gas inlet port and gas exhaust port of the reaction tube were closed. All of these processes were carried out in an Ar box.

(2) The reaction tube was removed from the Ar box and set in an electric furnace. A gas introduction line was connected to the reaction tube; the pressure in the introduction line was reduced; the gas inlet port to the reaction tube was then opened and the pressure within the reaction tube was reduced; and this was followed by recovery to atmospheric pressure using an ammonia/nitrogen mixed gas (2.7 volume % ammonia) to establish an ammonia/nitrogen mixed atmosphere within the reaction tube. After this, the gas exhaust port of the reaction tube was opened and an ammonia/nitrogen mixed gas (2.7 volume % ammonia) was passed through at 0.1 L/min (value converted to 20° C. and 1 atm) as the value set on the flow rate meter.

(3) Heating with the electric furnace was begun and the temperature within the reaction vessel was raised in 1 hour from room temperature to 750° C. and the LiCl salt was melted.

(4) After holding for 2 hours at 750° C., the seed attached at the end of the seed support rod was introduced into the solution (melt) in the reaction vessel and crystal growth was started. A GaN substrate (plate shape with a size of 5×10 mm, thickness=300 μm) that had the (20-21) plane for its main surface was used for the seed.

(5) After crystal growth had been carried out for 20 hours at 750° C., the seed was withdrawn from the solution, after which heating with the furnace was halted and the quartz reaction tube was cooled. After cooling, the seed was withdrawn from the reaction tube and the salt adhering to the seed was dissolved with water. The mass of the GaN crystal was increased by 4.4 weight % with reference to the mass of the seed prior to crystal growth and a GaN growth layer of GaN crystal was formed on the main surface of the seed. The thickness of the GaN growth layer that had formed was 15 μm. The obtained GaN growth layer was colorless and transparent according to the results of visual observation.

The following were found when the obtained GaN growth layer was submitted to SIMS measurement: an Si concentration of $5.0 \times 10^{17}$ cm$^{-3}$, an O concentration at or below the detection lower limit (actually measured value: $2.0 \times 10^{16}$ cm$^{-3}$, lower limit value: $5 \times 10^{16}$ cm$^{-3}$), and an Na concentration of $1.6 \times 10^{14}$ cm$^{-3}$.

The full width at half maximum in the rocking curve for the (201) diffraction peak in x-ray diffraction of the obtained GaN growth layer was 47 arcsec, indicating that the crystallinity of the obtained GaN growth layer was excellent. 97% of the obtained growth plane was a nonpolar plane or semipolar plane.

Figure 9:
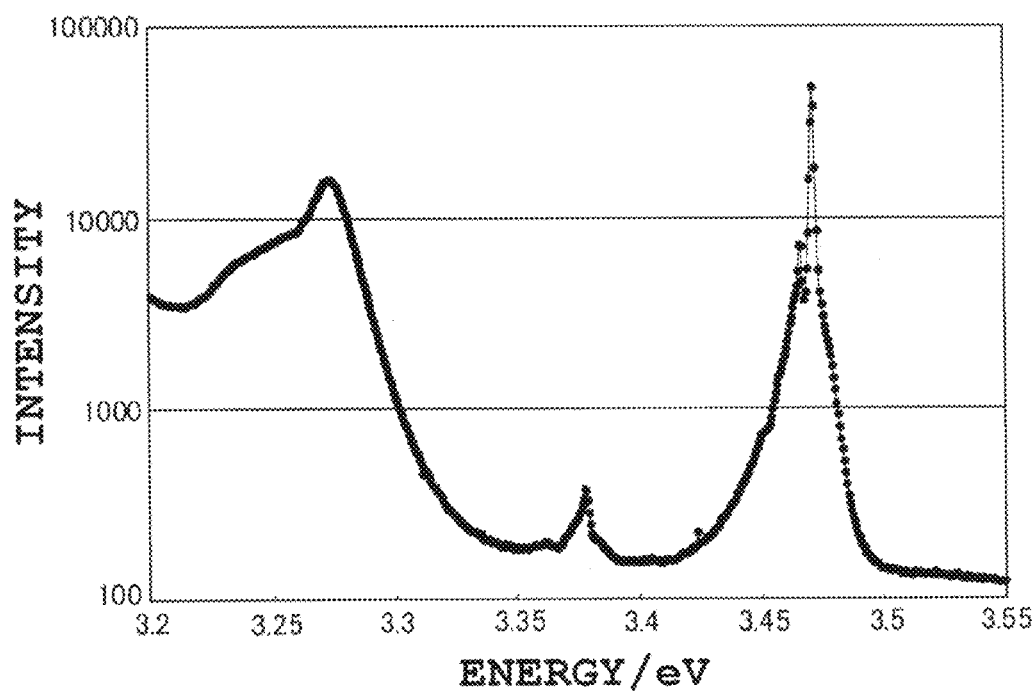
FIG. 9 is a graph that shows the results of a cryogenic PL measurement on the GaN crystal growth layer grown in Example 2.

(6) Low temperature PL measurement was carried out at a measurement temperature of 4 K using a He—Cd laser having a center wavelength of 325 nm as the excitation light source. The result is shown in FIG. 9. The ratio of the stacking fault-induced PL intensity in the vicinity of 3.41 eV to the band edge PL intensity was 0.003 for the produced GaN growth layer. According to the results of optical microscopic observations, the surface of the GaN growth layer was smooth; the flat region area in the crystal growth layer was 60 mm$^2$ as a whole; and the continuous flat region range was also 60 mm$^2$.

Comparative Example 1

The details of Comparative Example 1 are described with reference to the schematic diagram of the production apparatus given in FIG. 3.

(1) 1.44 g of Li$_3$GaN$_2$ (solid) and a mixture of 10.1 g of LiCl and 4.3 g of NaCl—which had been ground and mixed with a tungsten carbide mortar—as the solvent were introduced into a nitrided Ti reaction vessel having an outer diameter of 34 mm, an inner diameter of 30 mm, and a height of 200 mm. The Li$_3$GaN$_2$ used was Li$_3$GaN$_2$ having a particle diameter of at least 710 μm and not more than 2 mm as selected using a sieve. The Ti reaction vessel was nitrided by preliminarily introducing 45 g of LiCl and 4.5 g of $Li_3GaN_2$ into the Ti reaction vessel and heating for 60 hours at 745° C. under a nitrogen atmosphere.

(2) The Ti reaction vessel 104 was set in a quartz reaction tube 103 and the gas inlet port 100 and the gas exhaust port 101 of the quartz reaction tube were closed. All of these processes were carried out in an Ar box.

(3) The quartz reaction tube 103 was removed from the Ar box and set in an electric furnace 102. A gas introduction line was connected to this quartz reaction tube 103; the pressure in the introduction line was reduced; the gas inlet port 100 to the quartz reaction tube was then opened and the pressure within the quartz reaction tube 103 was reduced; and this was followed by recovery to atmospheric pressure using nitrogen gas to establish a nitrogen gas atmosphere within the quartz reaction tube 103. After this, the gas exhaust port 101 of the quartz reaction tube 103 was opened and nitrogen gas was passed through at 0.1 L/min as the amount converted to normal temperature and normal pressure (this throughflow was continued until the experiment was finished).

(4) Heating with the electric furnace was begun and the temperature within the Ti reaction vessel 104 was raised in 1 hour from room temperature to 745° C. The LiCl was melted to form a molten salt and the $Li_3GaN_2$, which was the starting material 106, dissolved in this molten salt to form a solution.

(5) After holding for 7 hours at 745° C., a seed 105 attached at the end of a seed support rod 107 was immersed in the solution 108 in the reaction vessel 104 and the seed was rotated at 100 rpm and crystal growth was started. A GaN substrate (plate shape with a size of 5×10 mm, thickness=320 μm) that had the (10-10) plane, a nonpolar plane, for its main surface was used for the seed. $Li_3GaN_2$ in the amount in excess of its solubility in the solution was present in solid form at the bottom of the reaction vessel 104.

(6) After crystal growth had been carried out for 93 hours at 745° C., the seed 105 was withdrawn from the solution 108, after which heating with the furnace was halted and the quartz reaction tube 103 was gradually cooled.

(7) The withdrawal of the seed 105 from the quartz reaction tube 103 yielded a GaN crystal in which a GaN growth layer had formed on the seed.

(8) The obtained GaN crystal was introduced into hot water in order to dissolve the salt adhering to the crystal. The GaN crystal mass was increased by 21.7 weight % with reference to the mass of the seed prior to crystal growth and a GaN growth layer of GaN crystal had formed on the main surface of the seed. The obtained GaN growth layer was light yellow according to visual observations.

SIMS measurements on the obtained growth layer gave an Si concentration of $2.2 \times 10^{18}$ cm$^{-3}$, an O concentration of $4.9 \times 10^{18}$ cm$^{-3}$, and an Na concentration of $7.4 \times 10^{18}$ cm$^{-3}$.

The full width at half maximum in the rocking curve for the (100) diffraction peak in x-ray diffraction of the obtained growth layer was 46 arcsec for x-rays entering in the direction parallel to the c-axis and was 85 arcsec for x-rays entering in the direction orthogonal to the c-axis. The full width at half maximum in the rocking curve for the (300) diffraction peak measured with x-rays incident in the direction orthogonal to the c-axis was 101 arcsec and the full width at half maximum in the rocking curve for the (102) diffraction peak measured with x-rays incident in the direction orthogonal to the c-axis was 44 arcsec, and these results all indicated a somewhat low crystallinity for the obtained growth layer. 60% of the obtained growth plane was a nonpolar plane or semipolar plane.

Comparative Example 2

The details of Comparative Example 2 are described with reference to the schematic diagram of the production apparatus given in FIG. 3.

(1) 5.4 g of $Li_3GaN_2$ (solid) and a mixture of 37.8 g of LiCl and 16.2 g of NaCl—which had been ground and mixed with a tungsten carbide mortar—as the solvent were introduced into a nitrided Ti reaction vessel having an outer diameter of 62 mm, an inner diameter of 58 mm, and a height of 200 mm. The $Li_3GaN_2$ used was $Li_3GaN_2$ having a particle diameter of at least 710 μm and not more than 2 mm as selected using a sieve. The Ti reaction vessel was nitrided by preliminarily introducing 54 g of LiCl and 5.4 g of $Li_3GaN_2$ into the Ti reaction vessel and heating for 60 hours at 745° C. under a nitrogen atmosphere.

(2) The Ti reaction vessel 104 was set in a quartz reaction tube 103 and the gas inlet port 100 and the gas exhaust port 101 of the quartz reaction tube were closed. All of these processes were carried out in an Ar box.

(3) The quartz reaction tube 103 was removed from the Ar box and set in an electric furnace 102. A gas introduction line was connected to this quartz reaction tube 103; the pressure in the introduction line was reduced; the gas inlet port 100 to the quartz reaction tube was then opened and the pressure within the quartz reaction tube 103 was reduced; and this was followed by recovery to atmospheric pressure using nitrogen gas to establish a nitrogen gas atmosphere within the quartz reaction tube 103. After this, the gas exhaust port 101 of the quartz reaction tube 103 was opened and nitrogen gas was passed through at 0.1 L/min as the amount converted to normal temperature and normal pressure (this throughflow was continued until the experiment was finished).

(4) Heating with the electric furnace was begun and the temperature within the Ti reaction vessel 104 was raised in 3.5 hours from room temperature to 745° C. The LiCl and NaCl were melted to form a molten salt and the $Li_3GaN_2$, which was the starting material 106, dissolved in this molten salt to form a solution.

(5) After holding for 7 hours at 745° C., a seed 105 attached at the end of a seed support rod 107 was immersed in the solution 108 in the reaction vessel 104 and the seed was rotated at 100 rpm and crystal growth was started. $Li_3GaN_2$ in the amount in excess of its solubility in the solution was present in solid form at the bottom of the reaction vessel 104. A GaN substrate (plate shape with a size of 5×10 mm, thickness=320 μm) that had the (10-11) plane, a semipolar plane, for its main surface was used for the seed.

(6) After crystal growth had been carried out for 101 hours at 745° C., the seed 105 was withdrawn from the solution 108, after which heating with the furnace was halted and the quartz reaction tube 103 was gradually cooled.

(7) The withdrawal of the seed 105 from the quartz reaction tube 103 yielded a GaN crystal in which a GaN growth layer had formed on the seed.

(8) The obtained GaN crystal was introduced into hot water in order to dissolve the salt adhering to the crystal. The GaN crystal mass was increased by 52.1 weight % with reference to the mass of the seed prior to crystal growth and a GaN growth layer of GaN crystal had formed on the main surface of the seed. The obtained GaN growth layer was yellowish-brown according to visual observations. 50% of the obtained growth plane was a nonpolar plane or semipolar plane.

SIMS measurements on the obtained growth layer gave an Si concentration of $1.3 \times 10^{18}$ cm$^{-3}$, an O concentration of $1.6 \times 10^{19}$ cm$^{-3}$, and an Na concentration of $1.1 \times 10^{19}$ cm$^{-3}$.

The full width at half maximum in the rocking curve for the (101) diffraction peak in x-ray diffraction of the obtained growth layer was 63 arcsec for x-rays entering in the direction parallel to the c-axis and was 78 arcsec for x-rays entering in the direction orthogonal to the c-axis. The full width at half maximum in the rocking curve for the (100) diffraction peak measured with x-rays incident in the direction orthogonal to the c-axis was 108 arcsec, and these results all indicated a somewhat low crystallinity for the obtained growth layer.

TABLE 1

| | Conditions | | | Dopant concentration [cm$^{-3}$] | |
|---|---|---|---|---|---|
| | Main surface | Starting material | Solution or melt | Gas throughflow | Si concentration | O concentration |
| Example 1 | (10-10) | Li$_3$GaN$_2$ | LiCl | H$_2$ + N$_2$ | $1.8 \times 10^{18}$ | $\leq 3 \times 10^{16}$ |
| | (10-11) | Li$_3$GaN$_2$ | LiCl | H$_2$ + N$_2$ | $3.5 \times 10^{18}$ | $\leq 3 \times 10^{16}$ |
| Example 2 | (20-21) | Li$_3$GaN$_2$ | LiCl | NH$_3$ + N$_2$ | $5.0 \times 10^{17}$ | $\leq 5 \times 10^{16}$ |
| Comparative example 1 | (10-10) | Li$_3$GaN$_2$ | LiCl + NaCl | N$_2$ | $2.2 \times 10^{18}$ | $4.9 \times 10^{18}$ |
| Comparative example 2 | (10-11) | Li$_3$GaN$_2$ | LiCl + NaCl | N$_2$ | $1.3 \times 10^{18}$ | $1.6 \times 10^{19}$ |

Example 3

(0) A GaN crystal grown by the HVPE method was prepared and this was used as the seed substrate in the form of a GaN substrate (plate shape with a size of 5×20 mm, thickness =300 μm) whose main surface was the (10-10) plane. Cryogenic PL measurements were performed at the four locations shown in FIG. 4 (Point 1 to Point 4) on this seed substrate. These results are given in FIG. 5. Law temperature PL measurement was carried out at a measurement temperature of 4 K using a He—Cd laser having a center wavelength of 325 nm as the excitation light source. The seed substrate used had a ratio between the stacking fault-induced PL intensity in the vicinity of 3.41 eV to the GaN band edge PL intensity of 0.17 to 0.87 and thus contained a large stacking fault population.

(1) 4.5 g of solid Li$_3$GaN$_2$ was introduced into a titanium (Ti) reaction vessel having an outer diameter of 34 mm, an inner diameter of 30 mm, and a height of 200 mm and 45 g of LiCl was then introduced into the reaction vessel as solvent after grinding with a tungsten carbide mortar. The solid Li$_3$GaN$_2$ used was Li$_3$GaN$_2$ having a particle diameter of at least 710 μm and not more than 2 mm as selected using a sieve. The reaction vessel and a seed support rod made of tungsten and bearing a GaN seed substrate were then set into a quartz reaction tube and the gas inlet port and gas exhaust port of the reaction tube were closed. All of these processes were carried out in an Ar box.

(2) The reaction tube was removed from the Ar box and set in an electric furnace. A gas introduction line was connected to the reaction tube; the pressure in the introduction line was reduced; the gas inlet port to the reaction tube was then opened and the pressure within the reaction tube was reduced; and this was followed by recovery to atmospheric pressure using a hydrogen/nitrogen mixed gas (10 volume % hydrogen) to establish a hydrogen/nitrogen mixed atmosphere within the reaction tube. After this, the gas exhaust port of the reaction tube was opened and a hydrogen/nitrogen mixed gas (10 volume % hydrogen) was passed through at 0.3 L/min (value converted to 20° C. and 1 atm) as the amount set at the flow meter.

(3) Heating with the electric furnace was begun and the temperature within the reaction vessel was raised in 1 hour from room temperature to 750° C. to provide a solvent in the form of the molten salt yielded by the melting of the LiCl salt.

(4) After holding for 2 hours at 750° C., the seed substrate attached at the end of a seed support rod was immersed in the solution (melt) in the reaction vessel and crystal growth was started. A GaN substrate (plate shape with a size of 5×10 mm, thickness=300 same as the left half in FIG. 4 for the substrate used in the previously described evaluation of the seed substrate) that had the (10-10) plane for its main surface was used as the seed substrate.

(5) After growth had been carried out for 89.5 hours at 750° C., the seed substrate was withdrawn from the solution, after which heating with the furnace was halted and the quartz reaction tube was cooled. After cooling, the seed substrate was withdrawn from the reaction tube and the salt adhering to the seed substrate was dissolved with water. A GaN crystal growth layer of GaN crystal had formed in a thickness of 23 μm on the main surface of the seed substrate. The obtained GaN growth layer was colorless and transparent according to visual observations, and, as in Examples 1 and 2, the O concentration in the GaN growth lower was considered to be sufficiently low and the Si concentration was considered to be higher than the O concentration.

Figure 6:
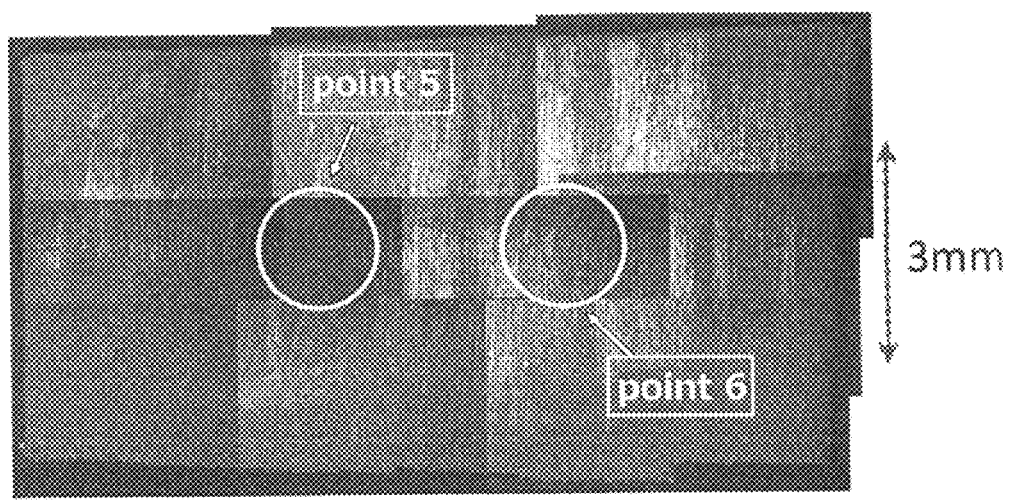
FIG. 6 is an optical microscopic observation of the surface of the GaN crystal growth layer grown in Example 3 (photograph in lieu of drawing)
Figure 7:
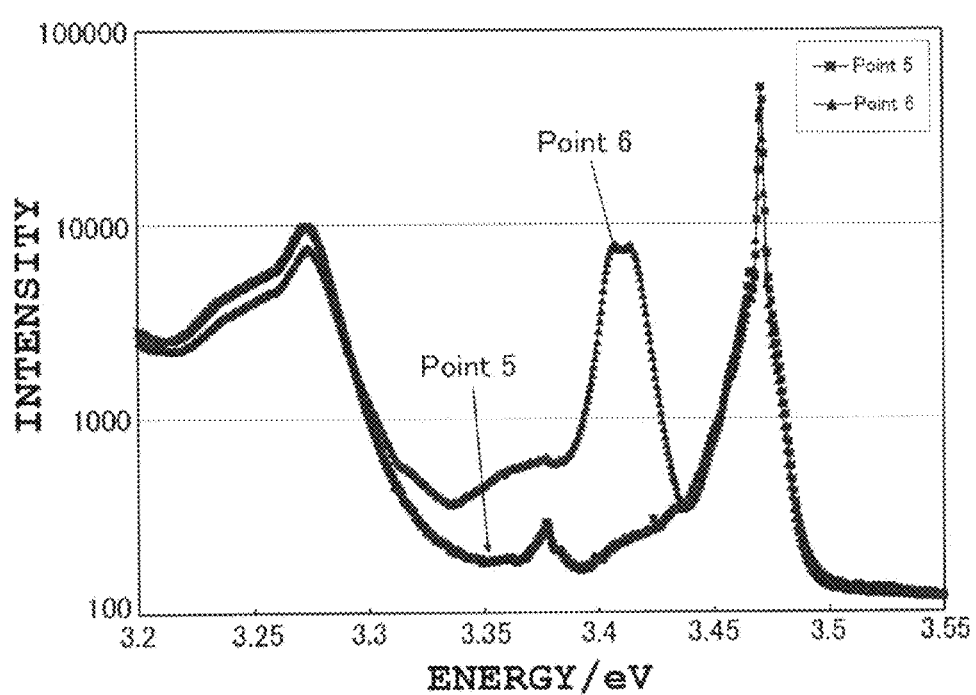
FIG. 7 is a graph that shows the results of cryogenic PL measurements on the GaN crystal growth layer grown in Example 3.

(6) PL measurement was carried out at a measurement temperature of 4 K using a He—Cd laser having a center wavelength of 325 nm as the excitation light source. The cryogenic PL measurements were run on the Point 5 and Point 6 shown in FIG. 6, and the results are given in FIG. 7. With a ratio of the stacking fault-induced PL intensity in the vicinity of 3.41 eV to the band edge PL intensity of 0.005, a region, in which the stacking faults had been substantially depleted, of the grown GaN crystal growth layer was observed to be present at Point 5. According to the results of optical microscopic observations, the growth surface was smooth for the stacking fault-depleted region and the flat region area for the crystal growth layer was 13 mm$^2$ as a whole and 10 mm$^2$ was continuous.

At Point 6, on the other hand, the ratio of the stacking fault-induced PL intensity in the vicinity of 3.41 eV to the band edge PL intensity was 0.18.

While the invention has been described in detail and with reference to specific embodiments thereof, it will be apparent to one skilled in the art that various changes and modifications can be made therein without departing from the spirit and scope thereof.

EXPLANATION OF REFERENCE NUMERALS 1 base substrate
2 growth layer formed by epitaxial growth
3 direction of growth
4 threading dislocation parallel to the direction of growth
5 threading dislocation for which the main direction is parallel to the direction of growth
6 growth direction component (main direction) of the direction of the threading dislocation
7 component, of the direction of the threading dislocation, in the direction orthogonal to the growth direction
8 base substrate
9 growth layer formed by epitaxial growth
10 growth direction
11 threading dislocation
12 crystal slice
100 gas inlet port
101 gas exhaust port
102 electric furnace
103 quartz reaction tube
104 reaction vessel
105 seed (base substrate)
106 starting material
107 seed support rod
108 solution or melt (liquid phase)
109 gas phase

The invention claimed is:

1. A gallium nitride crystal grown in a direction orthogonal to a nonpolar or semipolar plane thereof,
wherein, in a cryogenic PL spectrum of the crystal, measured at temperature of 20 K or below, an $I_2/I_1$ ratio is not greater than 0.1, where $I_1$ is a peak intensity of a band edge emission and $I_2$ is an intensity of an emission at 3.41 eV.

2. The gallium nitride crystal according to claim 1, wherein a Si concentration within the gallium nitride crystal is higher than an O concentration within the gallium nitride crystal.

3. The gallium nitride crystal according to claim 1, wherein the $I_2/I_1$ ratio is not greater than 0.05.

4. The gallium nitride crystal according to claim 1, wherein the $I_2/I_1$ ratio is not greater than 0.01.

5. The gallium nitride crystal according to claim 1, having a dislocation extending in a direction parallel to a growth direction of the gallium nitride crystal.

6. The gallium nitride crystal according to claim 5, wherein a density of the dislocation is not greater than $1.0 \times 10^8$ cm$^{-2}$.

7. The gallium nitride crystal according to claim 1, wherein a Si concentration within the gallium nitride crystal is at least $1 \times 10^{17}$ cm$^{-3}$.

8. The gallium nitride crystal according to claim 1, wherein an O concentration within the gallium nitride crystal is not greater than $3 \times 10^{18}$ cm$^{-3}$.

9. The gallium nitride crystal according to claim 1, wherein a Na concentration within the gallium nitride crystal is not greater than $1 \times 10^{17}$ cm$^{-3}$.

10. The gallium nitride crystal according to claim 1, wherein a growing direction of the gallium nitride crystal is orthogonal to the nonpolar plane thereof.

11. The gallium nitride crystal according to claim 10, comprising a gallium nitride crystal grown on a base substrate formed of gallium nitride for which a main surface of the base substrate is a nonpolar plane.

12. The gallium nitride crystal according to claim 1, wherein a growing direction of the gallium nitride crystal is orthogonal to the semipolar plane thereof.

13. The gallium nitride crystal according to claim 12, comprising a gallium nitride crystal grown on a base substrate formed of gallium nitride for which a main surface of the base substrate is a semipolar plane.

14. The gallium nitride crystal according to claim 1, wherein a size of the crystal along a growth direction thereof is at least 10 μm.

15. A substrate, comprising the gallium nitride crystal according to claim 1.

16. A method of manufacturing a semiconductor device, the method comprising
manufacturing the semiconductor device with the substrate according to claim 15.

17. The method according to claim 16, wherein the semiconductor device comprises a light emitting element.

18. The method according to claim 16, wherein the semiconductor device comprises an electronic device.

* * * * *